US011150278B2

(12) United States Patent
Guan

(10) Patent No.: US 11,150,278 B2
(45) Date of Patent: Oct. 19, 2021

(54) METHODS AND SYSTEMS FOR FAULT DIAGNOSIS

(71) Applicant: SHANGHAI UNITED IMAGING HEALTHCARE CO., LTD., Shanghai (CN)

(72) Inventor: Xiaolei Guan, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 470 days.

(21) Appl. No.: 16/023,128

(22) Filed: Jun. 29, 2018

(65) Prior Publication Data

US 2019/0049534 A1 Feb. 14, 2019

Related U.S. Application Data

(63) Continuation of application No. PCT/CN2017/120287, filed on Dec. 29, 2017.

(30) Foreign Application Priority Data

Aug. 9, 2017 (CN) .......................... 201710674295.4

(51) Int. Cl.
*G01R 33/36* (2006.01)
*G01R 19/165* (2006.01)
(Continued)

(52) U.S. Cl.
CPC ... *G01R 19/16566* (2013.01); *G01R 31/2822* (2013.01); *G01R 31/72* (2020.01);
(Continued)

(58) Field of Classification Search
CPC .... G01R 33/3628; G01R 31/50; G01R 31/72; G01R 33/3657; G01R 19/16566; G01R 31/2822; G01R 33/3415
See application file for complete search history.

(56) References Cited

U.S. PATENT DOCUMENTS

2002/0180437 A1* 12/2002 Reykowski ........ G01R 33/3657
324/309
2010/0277175 A1 11/2010 Weiss
(Continued)

FOREIGN PATENT DOCUMENTS

CN 101819263 A 9/2010
CN 103513196 A 1/2014
(Continued)

OTHER PUBLICATIONS

English translation of CN103852743 provided by Espacenet. (Year: 2020).*
(Continued)

*Primary Examiner* — Rishi R Patel
(74) *Attorney, Agent, or Firm* — Metis IP LLC

(57) ABSTRACT

The present disclosure relates to a control system and methods implemented on the control system. The control system includes a tuning/detuning system and a diagnosis system. The tuning/detuning system includes a first voltage source, a second voltage source, one or more coil arrays, and one or more tuning/detuning circuit drivers corresponding to the one or more coils arrays, respectively. The diagnosis system includes a first current sampling circuit and a processor. The first current sampling circuit is configured to obtain a first current. The processor is configured to diagnose the tuning/detuning system based on the first current.

19 Claims, 14 Drawing Sheets

(51) Int. Cl.
*G01R 31/28* (2006.01)
*G01R 31/72* (2020.01)
*G01R 33/3415* (2006.01)

(52) U.S. Cl.
CPC ..... *G01R 33/3628* (2013.01); *G01R 33/3657* (2013.01); *G01R 33/3415* (2013.01)

(56) References Cited

U.S. PATENT DOCUMENTS

| | | |
|---|---|---|
| 2013/0241556 A1 | 9/2013 | Bollenbeck et al. |
| 2014/0312902 A1 | 10/2014 | Tan et al. |
| 2018/0351371 A1 | 12/2018 | Xue |
| 2019/0049534 A1 | 2/2019 | Guan |

FOREIGN PATENT DOCUMENTS

| | | |
|---|---|---|
| CN | 103852743 A | 6/2014 |
| CN | 105388435 A | 3/2016 |
| CN | 105569859 A | 5/2016 |
| WO | 2016170588 A1 | 10/2016 |

OTHER PUBLICATIONS

First Office Action in Chinese Application No. 201710674295.4 dated Apr. 1, 2019, 10 pages.
Written Opinion in PCT/CN2017/120287 dated May 8, 2018, 5 pages.
International Search Report in PCT/CN2017/120287 dated May 8, 2018, 5 pages.

\* cited by examiner

METHODS AND SYSTEMS FOR FAULT DIAGNOSIS

CROSS-REFERENCE TO RELATED APPLICATIONS

The present disclosure is a continuation of international Application No. PCT/CN2017/120287, filed on Dec. 29, 2017, designating the United States of America, which claims priority of Chinese Application No. CN 201710674295.4 filed on Aug. 9, 2017, the content of which is hereby incorporated by reference in its entirety.

TECHNICAL FIELD

The present disclosure generally relates to methods and systems for fault diagnosis, and more particularly, to methods and systems for fault diagnosis of a tuning/detuning system of local coils in a magnetic resonance imaging (MRI) system.

BACKGROUND

Local coils are widely used in an MRI system. The local coils may include a variety of types, for example, abdomen coils, head coils. Local coil may be configured as one or more coil arrays, each of which may include one or more coil elements. A coil element may include one or more diodes, capacitors, inductors, etc. A tuning/detuning system may be used to control the local coils, referred to as tuning control and detuning control. The tuning control refers to making the diodes conduct, and the detuning control refers to making the diodes not conduct. In practice, fault diagnosis for the tuning/detuning system is needed.

SUMMARY

According to an aspect of the present disclosure, a control system may include a tuning/detuning system and a diagnosis system. The tuning/detuning system may include a first voltage source, a second voltage source, one or more coil arrays, and one or more tuning/detuning circuit drivers corresponding to the one or more coils arrays, respectively. The first voltage source, including a first output end, may be configured to provide a power supply that outputs a constant current. The second voltage source, including a second output end, may be configured to output a constant negative voltage. For each of the one or more coil arrays, the coil array may include one or more first diodes. The one or more first diodes may determine a tuning or detuning status of the coil array. For each of the one or more tuning/detuning circuit drivers, the tuning/detuning circuit may include a first input end, a second input end, a third output end, and a first control end. The first input end, electrically connected to the first output end of the first voltage source, may serve as a positive power supply input port and may be configured to output the constant current. The second input end, electrically connected to the second output end of the second voltage source, may serve as a negative power supply input port and may be configured to output the constant negative voltage. The third output end, electrically connected to a corresponding coil array, may be configured to output the constant current or the constant negative voltage that determines a conduction status of the one or more first diodes of the corresponding coil array. The diagnosis system may include a first current sampling circuit and a processor. The first current sampling circuit, including a fourth output end, may be configured to obtain a first current of the first output end. The processor, operatively connected to the fourth output end and at least one of the one or more first control ends, may be configured to determine the first input end or the second input end to be electrically connected to the third output end and to diagnose the tuning/detuning system based on the first current of the first output end.

In some embodiments, the first current sampling circuit may include a first analog-to-digital converter (ADC), a first operational amplifier, and a first sampling resistor. The first ADC may be electrically connected to the first operational amplifier in series and operatively connected to the processor. The first operational amplifier may be electrically connected to the first sampling resistor in parallel. The first sampling resistor may be electrically connected to the first voltage source in series and electrically connected to at least one of the one or more tuning/detuning circuit drivers in series.

In some embodiments, the diagnosis circuit system may include a first switch module and one or more dummy loads corresponding to the one or more tuning/detuning circuit drivers. Each dummy load of the one or more dummy loads, including one or more second diodes, may be electrically connected to a corresponding tuning/detuning circuit in parallel. The one or more dummy loads may be electrically connected to a common connecting end in parallel. The first switch module may be electrically connected to ground, electrically connected to the common connecting end, and operatively connected to the processor. The processor may be configured to cause the first switch module to turn on or turn off, and to diagnose the tuning/detuning system based on the first current.

In some embodiments, the diagnosis circuit system may include a second current sampling circuit. The second current sampling circuit, operatively connected to the processor, may be configured to obtain a second current of the common connecting end. The processor may be configured to diagnose the tuning/detuning system based on the second current.

In some embodiments, the second current sampling circuit may include a second ADC, a second operational amplifier, and a second resistor. The second ADC may be electrically connected to the second operational amplifier in series and operatively connected to the processor. The second operational amplifier may be electrically connected to the second resistor in parallel. The second resistor may be electrically connected to the first switch module in series and electrically connected to at least one of the one or more dummy loads in series.

In some embodiments, the diagnosis circuit system may include a third resistor, a second switch module, and a voltage comparison circuit. The third resistor may be electrically connected to the second switch module in parallel. A first end of the third resistor may be electrically connected to the second voltage source. A second end of the third resistor may be electrically connected to at least one of the one or more tuning/detuning circuit drivers. The voltage comparison circuit may be electrically connected to the second end of the third resistor and operatively connected to the processor. The voltage comparison circuit may be configured to obtain a first voltage of the second end of the third resistor and compare the first voltage with a reference voltage. The processor may be configured to diagnose the tuning/detuning system based on the comparison between the first voltage and the reference voltage.

In some embodiments, the diagnosis circuit system may include a third switch module. The third switch module may be electrically connected to the second voltage source in series, electrically connected to the third resistor in series, and operatively connected to the processor. The processor may be configured to cause the third switch module to turn on or turn off.

In some embodiments, the first voltage source may include a DC-DC controller, a fourth resistor, and a variable resistor. The DC-DC controller may be electrically connected to the first output end of the first voltage source though an output end of the DC-DC controller. The fourth resistor may be electrically connected to ground and electrically connected to the DC-DC controller through a feedback input of the DC-DC controller. The variable resistor may be electrically connected to the fourth resistor, electrically connected to the first output end of the first voltage source, and operatively connected to the processor. The processor may be configured to cause an equivalent resistance value of the variable resistor to change.

According to an aspect of the present disclosure, a method implemented on the control system may include determining, by the diagnosis circuit system, an expected value of an electrical signal according to at least one of an operation status of a radio frequency system, a tuning or detuning status of the one or more coil arrays, and types of voltage sources of the one or more tuning/detuning circuit drivers; obtaining a first actual value of the electrical signal; and performing, by the diagnosis circuit system, fault diagnosis on the tuning/detuning system based on the expected value of the electrical signal and the first actual value of the electrical signal.

In some embodiments, the determining the expected value of the electrical signal may include upon a detection that the radio frequency system is idle and the one or more coil arrays may be electrically connected to the radio frequency system, making the second voltage source as the voltage source of the one or more tuning/detuning circuit drivers. The performing fault diagnosis on the tuning/detuning system may include determining whether the first actual value of the first current falls within the first expected range of the first current.

In some embodiments, the performing fault diagnosis on the tuning/detuning system may further include determining that the first actual value of the first current falls within the first expected range of the first current; and in response to a determination that the first actual value of the first current falls within the first expected range of the first current, determining that no short circuit exists at the one or more first input ends of the one or more tuning/detuning circuit drivers.

In some embodiments, the performing fault diagnosis on the tuning/detuning system may further include determining that the first actual value of the first current fails to fall within the first expected range of the first current; and in response to a determination that the first actual value of the first current fails to fall within the first expected range of the first current, determining that a short circuit exists at at least one of the one or more first input ends of the one or more tuning/detuning circuit drivers.

In some embodiments, the performing fault diagnosis on the tuning/detuning system may further include changing a type of the voltage source of one of the one or more tuning/detuning circuit drivers to the first voltage source; obtaining a second actual value of the first current; and determining whether the second actual value of the first current increases by a predetermined increment.

In some embodiments, the performing fault diagnosis on the tuning/detuning system may further include determining that the second actual value of the first current increases by a predetermined increment; and in response to a determination that the second actual value of the first current increases by the predetermined increment, determining that the tuning/detuning circuit driver and a corresponding coil array are normal.

In some embodiments, the performing fault diagnosis on the tuning/detuning system may further include determining that the second actual value of the first current fails to increase by a predetermined increment; and in response to a determination that the second actual value of the first current fails to increase by the predetermined increment, determining that an open circuit exists in the tuning/detuning circuit driver or a corresponding coil array.

In some embodiments, the determining the expected value of the electrical signal may include upon a detection that the radio frequency system is performing a scan and the one or more coil arrays may be electrically connected to the radio frequency system, determining a second expected range of the first current according to the number of coil arrays whose voltage source is the first voltage source. The performing fault diagnosis on the tuning/detuning system may include determining whether the first actual value of the first current falls within the second expected range of the first current.

In some embodiments, the performing fault diagnosis on the tuning/detuning system may further include determining that the first actual value of the first current falls within the second expected range of the first current; and in response to a determination that the first actual value of the first current falls within the second expected range of the first current, determining that the one or more tuning/detuning circuit drivers and the one or more coil arrays are normal.

In some embodiments, the performing fault diagnosis on the tuning/detuning system may further include determining that the first actual value of the first current is lower than a lower limit of the second expected range of the first current; and in response to a determination that the first actual value of the first current is lower than the lower limit of the second expected range of the first current, determining that an open circuit exists in at least one of the one or more tuning/detuning circuit drivers or the one or more coil arrays.

In some embodiments, the performing fault diagnosis on the tuning/detuning system may further include determining that the actual value of the first current is greater than an upper limit of the second expected range of the first current; and in response to a determination that the actual value of the first current is greater than the upper limit of the second expected range of the first current, determining that a short circuit exists in at least one of the one or more tuning/detuning circuit drivers or the one or more coil arrays.

In some embodiments, the method may further include changing a type of the voltage source of one of the one or more tuning/detuning circuit drivers; determining a second actual value of the first current; and determining whether the second actual value of the first current increases or decreases by a predetermined increment.

In some embodiments, the method may further include determining that the second actual value of the first current increases or decreases by the predetermined increment; and in response to a determination that the second actual value of the first current increases or decreases by the predetermined increment, determining that the tuning/detuning circuit driver and a corresponding coil array are normal.

In some embodiments, the method may further include determining that the second actual value of the first current fails to increase or decrease by the predetermined increment; and in response to a determination that the second actual value of the first current fails to increase or decrease by the predetermined increment, determining that an open circuit exists in tuning/detuning circuit driver or a corresponding coil array.

In some embodiments, the method may further include upon a detection that the radio frequency system is idle and the one or more coil arrays are electrically disconnected from the radio frequency system, making the second voltage source as the voltage source of the one or more tuning/detuning circuit drivers, and determining a third expected range of the first current; determining a first actual value of the first current; and determining whether the first actual value of the first current falls within the third expected range of the first current.

In some embodiments, the method may further include determining that the first actual value of the first current falls within the third expected range of the first current; and in response to a determination that the first actual value of the first current falls within the third expected range of the first current, determining that no short circuit exists at the one or more first input ends of the one or more tuning/detuning circuit drivers.

In some embodiments, the method may further include determining that the first actual value of the first current fails to fall within the third expected range of the first current; and in response to a determination that the actual value of the first current fails to fall within the third expected range of the first current, determining that a short circuit exists at at least one of the one or more first input ends of the one or more tuning/detuning circuit drivers.

In some embodiments, the method may further include changing a type of the voltage source of one of the one or more tuning/detuning circuit drivers to the first voltage source; determining a second actual value of the first current; and determining whether the second actual value of the first current increases by a predetermined increment.

In some embodiments, the method may further include determining that the second actual value of the first current increases by the predetermined increment; and in response to a determination that the second actual value of the first current increases by the predetermined increment, determining that no short circuit exists at the first input end of the tuning/detuning circuit driver.

In some embodiments, the method may further include determining that the second actual value of the first current fails to increase by the predetermined increment; and in response to a determination that the actual value of the first current fails to increase by the predetermined increment, determining that a short circuit exists at the first input end of the tuning/detuning circuit driver.

In some embodiments, the method may further include changing a type of the voltage source of one of the one or more tuning/detuning circuit drivers to the first voltage source; determining a second actual value of the first current; and determining whether the second actual value of the first current increases by a predetermined increment.

In some embodiments, the method may further include determining that the second actual value of the first current fails to increase by the predetermined increment; and in response to a determination that the second actual value of the first current fails to increase by the predetermined increment, determining that an open circuit exists in the tuning/detuning circuit driver.

In some embodiments, the method may further include determining that the second actual value of the first current increases by the predetermined increment; in response to a determination that the second actual value of the first current increases by the predetermined increment, determining an actual value of the second current; and determining whether the actual value of the second current increases by the predetermined increment.

In some embodiments, the method may further include determining that the actual value of the second current increases by the predetermined increment; and in response to a determination that the actual value of the second current increases by the predetermined increment, determining that no short circuit exists at the third output end of the tuning/detuning circuit driver.

In some embodiments, the method may further include determining that the actual value of the second current fails to increase by the predetermined increment; and in response to a determination that the actual value of the second current fails to increase by the predetermined increment, determining that a short circuit exists at the third output end of the tuning/detuning circuit driver.

According to an aspect of the present disclosure, a method implemented on the control system may include upon a detection that a radio frequency system is idle and the one or more coil arrays may be electrically connected to the radio frequency system, making the second voltage source as the voltage source of the one or more tuning/detuning circuit drivers and determining a first expected value of a first voltage; determining an actual value of the first voltage; and determining whether the actual value of the first voltage is greater than the first expected value of the first voltage.

In some embodiments, the method may further include determining that the actual value of the first voltage is greater than the first expected value of the first voltage; and in response to a determination that the actual value of the first voltage is greater than the first expected value of the first voltage, determining that no short circuit exists in the one or more tuning/detuning circuit drivers and the one or more coil arrays.

In some embodiments, the method may further include determining that the actual value of the first voltage is not greater than the first expected value of the first voltage; and in response to a determination that the actual value of the first voltage is not greater than the first expected value of the first voltage, determining that a short circuit exists in at least one of the one or more tuning/detuning circuit drivers or the one or more coil arrays.

According to an aspect of the present disclosure, a method implemented on the control system may include upon a detection that a radio frequency system is idle and the one or more coil arrays are electrically disconnected from the radio frequency system, making the second voltage source as the voltage source of the one or more tuning/detuning circuit drivers and determining a second expected value of a first voltage; determining an actual value of the first voltage; and determining whether the actual value of the first voltage is greater than the second expected value of the first voltage.

In some embodiments, the method may further include determining that the actual value of the first voltage is greater than the second expected value of the first voltage; and in response to a determination that the actual value of the first voltage is greater than the second expected value of the first voltage, determining that no short circuit exists in the one or more tuning/detuning circuit driver.

In some embodiments, the method may further include determining that the actual value of the first voltage is not greater than the second expected value of the first voltage; and in response to a determination that the actual value of the first voltage is not greater than the second expected value of the first voltage, determining that a short circuit exists in at least one of the one or more tuning/detuning circuit drivers.

According to an aspect of the present disclosure, a method implemented on the control system may include upon a detection that the first voltage source as voltage source of the one or more tuning/detuning circuit drivers, determining an output voltage of the first voltage source according to configurations of the one or more coil arrays; determining an expected value of an electrical signal according to at least one of an operation status of a radio frequency system, a tuning or detuning status of the one or more coil arrays, and types of voltage sources of the one or more tuning/detuning circuit drivers; determining an actual value of the electrical signal; and performing fault diagnosis on the tuning/detuning system based on the expected value of the electrical signal and the actual value of the electrical signal.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein.

DETAILED DESCRIPTION

Figure 1:
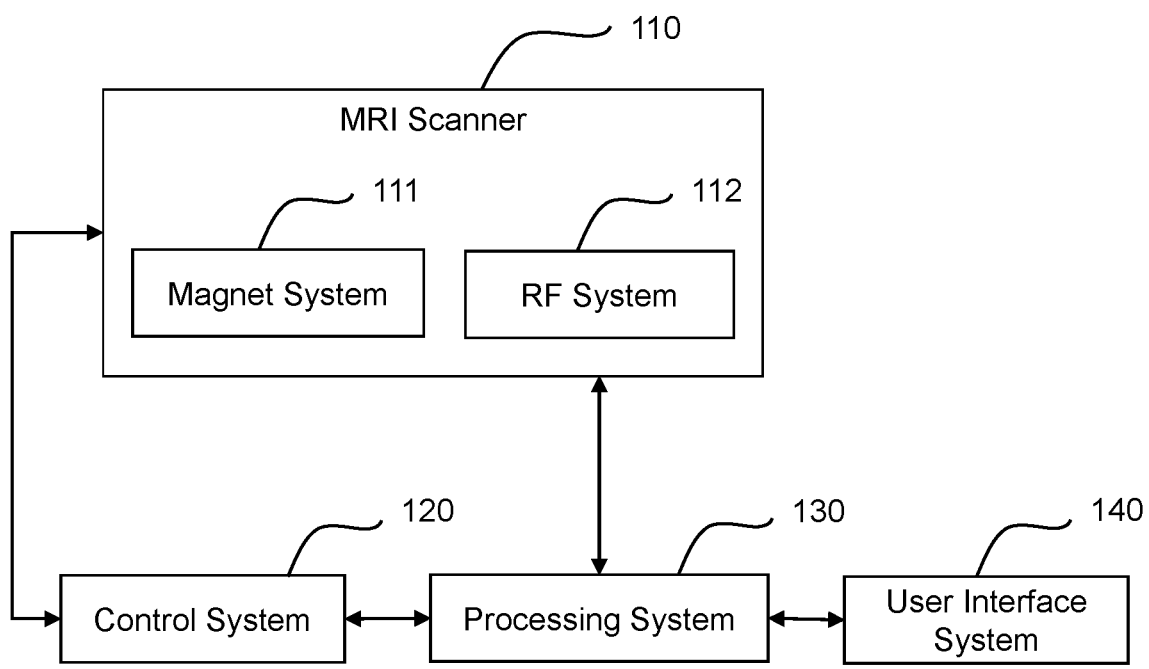
FIG. 1 illustrates an exemplary magnetic resonance imaging system 100 according to some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirits and scope of the present disclosure. Thus, the present disclosure is not limited to the embodiments shown, but to be accorded the widest scope consistent with the claims.

It will be understood that the term "system," "module," "unit," and/or "block" used herein are one method to distinguish different components, elements, parts, section or assembly of different level in descending order. However, the terms may be displaced by another expression if they may achieve the same purpose.

It will be understood that when a unit, module or block is referred to as being "on," "connected to" or "coupled to" another unit, module, or block, it may be directly on, connected or coupled to the other unit, module, or block, or intervening unit, module, or block may be present, unless the context clearly indicates otherwise. As used herein, the term "and/or" includes any and all combinations of one or more of the associated listed items.

The terminology used herein is for the purposes of describing particular examples and embodiments only, and is not intended to be limiting. As used herein, the singular forms "a," "an," and "the" may be intended to include the plural forms as well, unless the context clearly indicates otherwise. It will be further understood that the terms "include," and/or "comprise," when used in this disclosure, specify the presence of integers, devices, behaviors, stated features, steps, elements, operations, and/or components, but do not exclude the presence or addition of one or more other integers, devices, behaviors, features, steps, elements, operations, components, and/or groups thereof.

The control system in the present disclosure is described primarily in regard to a diagnosis circuit system that may be used to diagnose a tuning/detuning system of local coils of an MRI system. Based on the diagnosis circuit system, a method is provided to diagnose the tuning/detuning system. According to the method, an expected value of an electrical signal of a sampling circuit may be determined according to the operation status of a radio frequency (RF) system, the tuning or detuning status of local coils, and types of voltage sources; an actual value of the electrical signal may be determined; and fault diagnosis of the tuning/detuning system may be performed based on the expected value of the electrical signal and the actual value of the electrical signal.

FIG. 1 illustrates an exemplary magnetic resonance imaging system according to some embodiments of the present disclosure. As illustrated, an MRI system 100 may include an MRI scanner 110, a control system 120, a processing system 130, and a user interface system 140. The MRI scanner 110 may include a magnet system 111 and a radio frequency (RF) system 112.

The magnet system 111 may include a main magnetic field generator and/or a gradient magnetic field generator (not shown in FIG. 1). The main magnetic field generator may include a main magnet that creates a static magnetic field Bo during an MRI process. The main magnet may be of various types including, for example, a permanent magnet, a superconducting electromagnet, a resistive electromagnet, etc. The gradient magnetic field generator may generate magnetic field gradients in the X, Y, and/or Z directions. As used herein, the X direction is also referred to as the readout (RO) direction, the Y direction is also referred to the phase encoding (PE) direction, the Z direction is also referred to the slice-select (SS) direction. The gradient magnetic field may encode the spatial information of a subject (to be examined) located in the MRI scanner 110.

The RF system 112 may include RF transmitting coils and/or receiving coils. The transmitting coils may transmit RF pulses to excite a region of interest of the subject. Then the region of interest may generate echo signals. The receiving coils may receive the echo signals. In some embodiments, according to the difference in function and size, the RF coils may be classified as volume coils and local coils. The volume coils may be configured as birdcage coils, transverse electromagnetic coils, saddle coils, Helmholtz coils, etc. The local coils may include phased head coils, abdomen coils, etc.

The control system 120 may control the magnet system 111, the RF system 112 of the MRI scanner 110, the processing system 130, and/or the user interface system 140. The control system 120 may receive information from or send information to the MRI scanner 110, the processing system 130, and/or the user interface system 140. According to some embodiments of the present disclosure, the control system 120 may receive commands from the user interface system 140 provided by, e.g., a user, and cause the magnet system 111 and/or RF system 112 to image a region of interest according to the received commands. According to some embodiments of the present disclosure, the control system 120 may include a tuning/detuning system of the local coils of the RF system 112, and a diagnosis circuit system for diagnosing the tuning/detuning system. Descriptions regarding the control system 120 may be found elsewhere in the present disclosure. See, e.g., FIGS. 2 to 6 and the descriptions thereof.

In some embodiments, the control system 120 may include one or more processing units (e.g., single-core processor(s) or multi-core processor(s)). Merely by way of example, the processing system 130 may include a central processing unit (CPU), an application-specific integrated circuit (ASIC), an application-specific instruction-set processor (ASIP), a graphics processing unit (GPU), a physics processing unit (PPU), a digital signal processor (DSP), a field programmable gate array (FPGA), a programmable logic device (PLD), a controller, a microcontroller unit, a reduced instruction-set computer (RISC), a microprocessor, or the like, or any combination thereof.

The processing system 130 may process different kinds of information received from different systems. In some embodiments, the processing system 130 may include one or more processing units. The one or more processing units may be the same as or different from the one or more processing units included in the control system 120.

For further understanding the present disclosure, several examples are given below, but the examples do not limit the scope of the present disclosure. For example, in some embodiments, the processing system 130 may process MR signals received from the RF system 112 and generate one or more MR images based on the MR signals and deliver the one or more MR images to the user interface system 140 to be displayed, output for storage or transmission to a terminal, etc. In some embodiments, the processing system 130 may process data input by a user (e.g., an operator) via the user interface system 140, transform the data into specific commands, and supply the commands to the control system 120. In some embodiments, the processing system 130 may process imaging data acquired by the MRI scanner 110 to generate images.

The user interface system 140 may receive input and/or display output information. The input and/or output information may include programs, software, algorithms, data, text, number, images, voice, or the like, or any combination thereof. For example, a user may input one or more initial parameters or conditions to initiate a scan. As another example, some information may be imported from an external resource, such as a floppy disk, a hard disk, a wireless terminal, or the like, or any combination thereof. In some embodiments, the user interface system 140 may include an input device and/or a display device. The input device may include a keyboard, a touch screen, a mouse, a remote controller, or the like, or any combination thereof. The display device may include liquid crystal display (LCD), a light-emitting diode (LED)-based display, a flat panel display, a curved screen, a television device, a cathode ray tube (CRT), a touch screen, or the like, or a combination thereof. In some embodiments, the input device and the display device may be an integrated device that has both input and display functions.

In some embodiments, the control system 120, the processing system 130, and/or the user interface system 140 may be integrated into an MRI console. An operator may set parameters in MRI scanning, control the imaging procedure, view the images produced through the MRI console.

It should be noted that the above description of the MRI system 100 is merely provided for the purposes of illustration, and not intended to limit the scope of the present disclosure. For persons having ordinary skills in the art, multiple variations and modifications may be made under the teachings of the present disclosure. For example, the assembly and/or function of the MRI system 100 may be varied or changed according to specific implementation scenarios. Merely by way of example, some other components may be added into the MRI system 100, such as a patient positioning module, a gradient amplifier module, and other devices or modules. The MRI system may be a single-modality medical system, or part of a multi-modality system including, e.g., a positron emission tomography-magnetic resonance imaging (PET-MRI) system, etc. However, those variations and modifications do not depart from the scope of the present disclosure.

Figure 2:
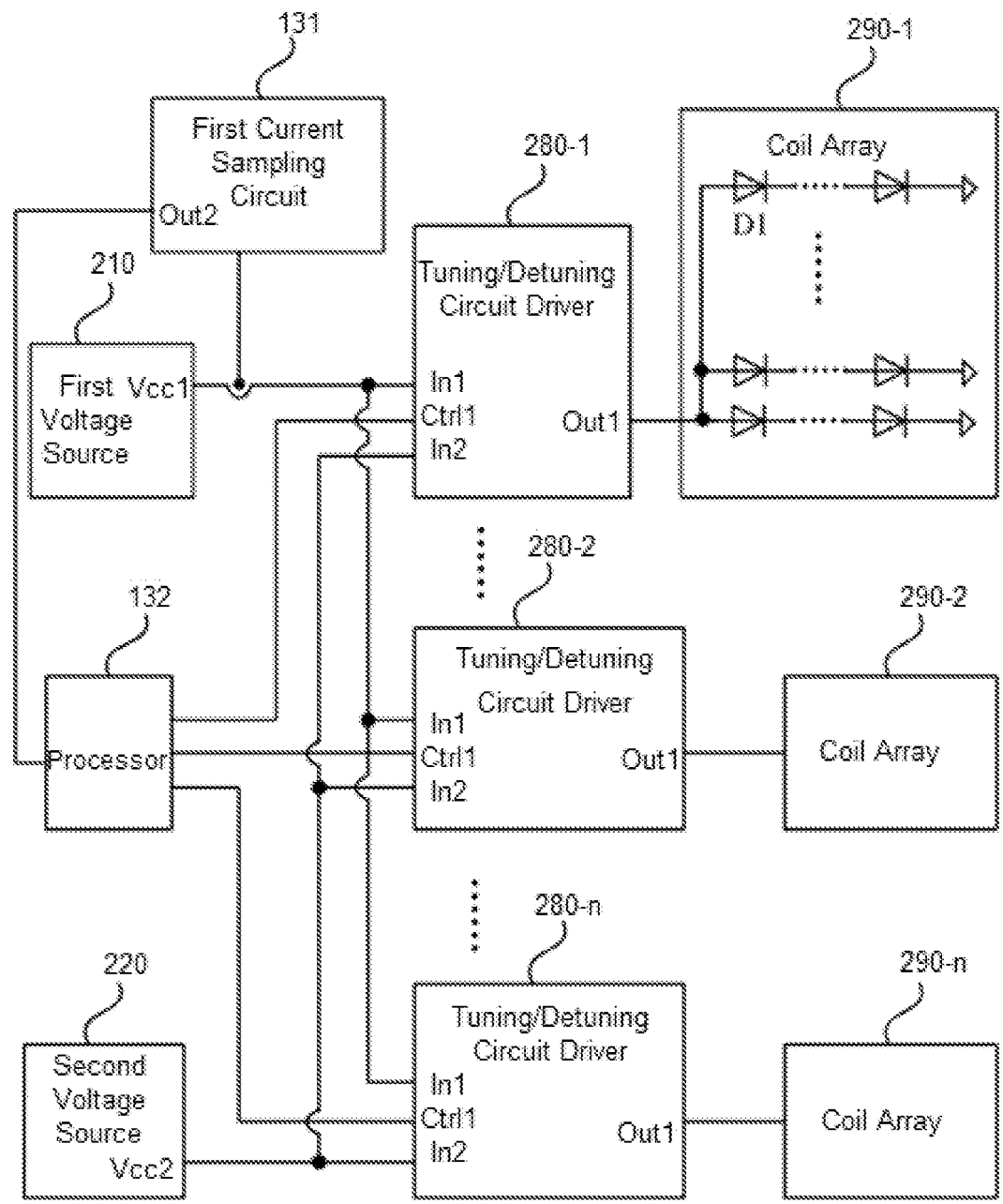
FIG. 2 illustrates an exemplary control system including a fault diagnosis circuit system for a tuning/detuning system according to some embodiments of the present disclosure.

FIG. 2 illustrates an exemplary control system 120 including a fault diagnosis circuit system for a tuning/detuning system according to some embodiments of the present disclosure. The exemplary control system 120 as illustrated in FIG. 2 may include a tuning/detuning system and a fault diagnosis circuit system. The tuning/detuning system may include a first voltage source 210, a second voltage source 220, local coils, and one or more tuning/detuning circuit drivers 280-1, 280-2, . . . , 280-n. The fault diagnosis circuit system may include a current sampling circuit 131 and a processor 132.

Figure 5:
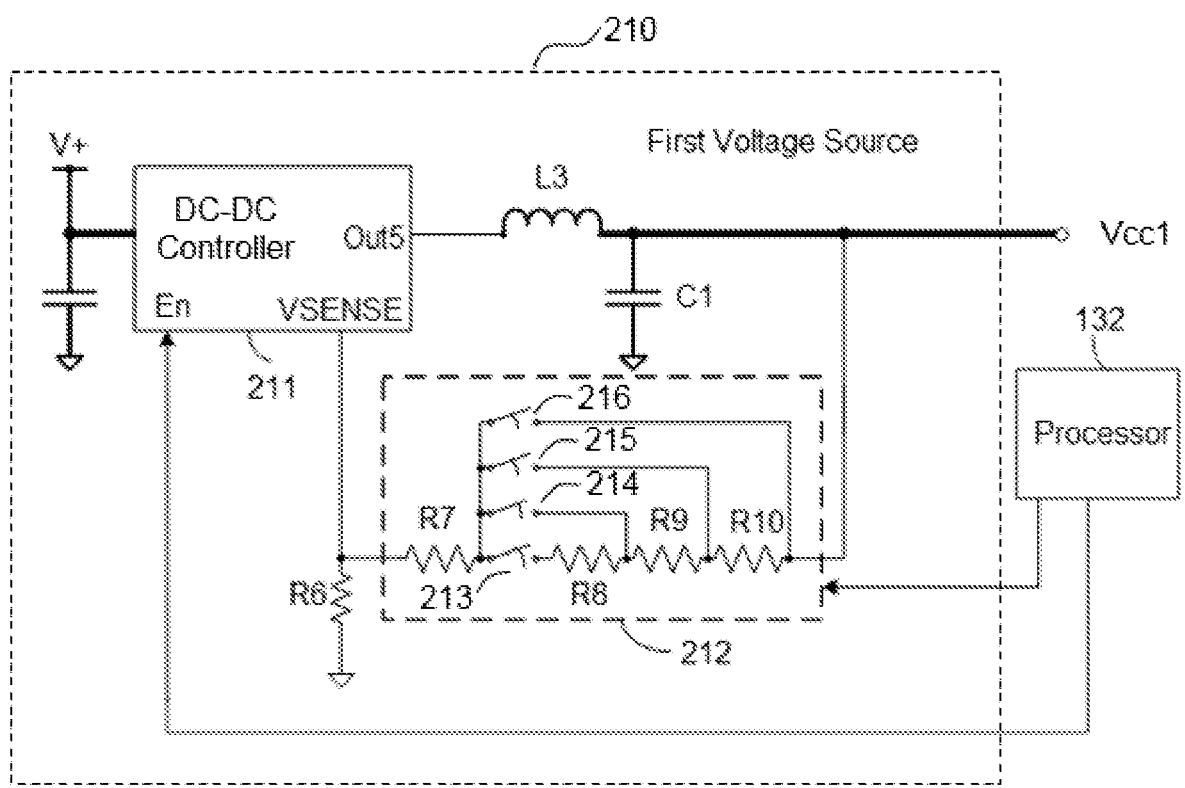
FIG. 5 illustrates an exemplary first voltage source according to some embodiments of the present disclosure.

The first voltage source 210 may be configured to provide a power supply of a constant-current source (not shown in FIG. 2). Thus, the constant-current source may be configured to output a constant current. In the present disclosure, for brevity, the first voltage source 210 may serve as the constant-current source configured to output a constant current. FIG. 5 illustrates an example of the first voltage source 210. The second voltage source 220 may be configured to output a constant negative voltage through an output end Vcc2.

The local coils may include one or more coil arrays 290-1, 290-2, . . . , 290-n. In some embodiments, a coil array (e.g., 290-1, 290-2, 290-n) may correspond to a tuning/detuning circuit drivers (e.g., 280-1, 280-2, . . . , 280-n). A coil array (e.g., 290-1, 290-2, 290-n) may be electrically connected to the corresponding tuning/detuning circuit driver in series. For example, the coil array 290-1 may be electrically connected to the tuning/detuning circuit driver 280-1 in series. As another example, the coil array 290-2 may be electrically connected to the tuning/detuning circuit driver 280-2 in series. As still another example, the coil array 290-n may be electrically connected to the tuning/detuning circuit driver 280-n in series.

A coil array (e.g., 290-1, 290-2, . . . , 290-n) may include one or more coil elements. The coil elements of a coil array may be electrically connected in series or in parallel. A coil element may include one or more diodes D1 (for example, a PIN diode). The diodes D1 of a coil element may be electrically connected in series or parallel. The one or more diodes D1 may conduct or not conduct. When all of the one or more diodes D1 conduct, the coil element may be in a detuning state. Further, when all of the one or more coil elements in a coil array are in the detuning state, the coil array may be in the detuning state accordingly. When all of the one or more diodes D1 do not conduct, the coil element may be in a tuning state. Further, when all of the one or more coil elements in a coil array are in the tuning state, the coil array may be in the tuning state accordingly. It should be noted that different coil elements may also be electrically connected in series or parallel. Different coil elements may include the same or different numbers of diodes D1.

Each of the one or more coil arrays 290-1, 290-2, . . . , 290-n may be of a configuration. The configuration of a coil array may relate to the number of diodes D1 and the connection between the diodes D1 of the coil array. For brevity, the configuration of the coil array may be presented by i*j. The i*j coil array may refer to a coil array including i*j diodes D1. For an i*j coil array, every i diodes D1 may be electrically connected in series, forming a series branch; the coil array may include j series branches. The j series branches may be electrically connected in parallel. Each of i and j are an integral number more than zero. Merely by way of example, the configuration of the coil array may include 3*4, 4*5, 5*2, etc. It should be noted that the configurations of the coil arrays 290-1, 290-2, . . . , 290-n may be the same or different. For example, the local coils may include 1*j coil arrays and 2*j coil arrays.

A tuning/detuning circuit driver (e.g., 280-1, 280-2, . . . , 280-n) may be configured to drive a coil array (e.g., 290-1, 290-2, . . . , 290-n). A tuning/detuning circuit driver (e.g., 280-1, 280-2, . . . , 280-n) may include an input end In1, an input end In2, a control end Ctrl1, and an output end Out1. The input end In1 may be electrically connected to the output end Vcc1 of the first voltage source 210. The input end In1 may serve as a positive power supply input port. When the input end In1 is an input end of the tuning/detuning circuit driver, the tuning/detuning circuit driver may be configured to output a constant current. The input end In2 may be electrically connected to the output end Vcc2 of the second voltage source 220. The input end In2 may serve as a negative power supply input port. When the input end In2 is an input end of the tuning/detuning circuit driver, the tuning/detuning circuit driver may be configured to output a constant negative voltage. The control end Ctrl1 may be configured to receive commands indicating whether to select the input end In1 or the input end In2 as the input end of the tuning/detuning system. The commands may be transmitted from the processor 132.

The current sampling circuit 131 may be configured to sample a first current. The first current may refer to a current outputted by the constant-current source provided by the first voltage source 210 and/or a current between the first voltage source 210 and a tuning/detuning circuit driver (e.g., 280-1, 280-2, . . . , 280-n). The first current may be digitalized, for example, using an analog-to-digital converter (ADC) of the first current sampling circuit 131, which is exemplified below. The current sampling circuit 131 may sample an actual value of the first current and output the actual value of the first current to the processor 132 through the Out2.

The processor 132 may be configured to command the one or more tuning/detuning circuit drivers 280-1, 280-2, . . . , 280-n. For example, the processor 132 may cause a tuning/detuning circuit driver to select the first input end In1 as the input end through the control end Ctrl1. In other words, the processor 132 may be configured to select the first voltage source 210 as the voltage source of the corresponding coil array. As another example, the processor 132 may cause a tuning/detuning circuit driver to select the second input end In2 as the input end through the control end Ctrl1. In other words, the processor 132 may be configured to select the second voltage source 220 as the voltage source of the corresponding coil array.

The processor 132 may further be configured to perform fault diagnosis of the tuning/detuning system. In some embodiments, the processor 132 may perform the fault diagnosis based on an electrical signal acquired by a sampling circuit. For example, the processor 132 may obtain an actual value and an expected value of the electrical signal. Further, the processor 132 may perform the fault diagnosis based on the actual value and the expected value of the electrical signal. The sampling circuit may refer to a current sampling circuit, a voltage comparison circuit, etc. The electrical signal of the sampling circuit may include a current (e.g., the first current, the second current), a voltage, or the like, or a combination thereof. In some embodiments, the processor 132 may perform the fault diagnosis as descriptions in connection with FIGS. 6 to 14.

To facilitate the description of the tuning/detuning system and the fault diagnosis circuit system in the present disclosure, more descriptions may be illustrated below. As illustrated in FIG. 2, the positive end of one end diode D1 may be electrically connected to the output end Out1 and the negative end of the other end diode D1 may be electrically connected to the ground. In some embodiments, if the processor 132 selects the first voltage source 210 as the voltage source of the tuning/detuning circuit driver, i.e., the processor 132 causes the tuning/detuning circuit driver to select the input end In1 as the input end of the tuning/detuning circuit driver through the control end Ctrl1, the output end Out1 may output a constant current to the corresponding coil array. In these embodiments, the diodes D1 in the corresponding coil array may conduct, meaning that the corresponding coil array is in the detuning state. Thus, a current passing through the corresponding coil array may be the same or substantially the same as the constant current. Accordingly, an expected value of a current passing through the output end Vcc1 (i.e., the first current described in the present disclosure) may be determined based on the number of coil arrays or dummy loads (see, e.g., FIG. 3) whose voltage source is the first voltage source 210, as illustrated below:

$$I_1 = I_C \times m, \qquad (1)$$

where $I_1$ may refer to the expected value of the first current, $I_C$ may refer to the constant current, and m may refer to the number of coil arrays or dummy loads whose voltage source is the first voltage source 210.

For example, if the voltage source of the total coil arrays (i.e., all of the one or more coil arrays 290-1, 290-2, ..., 290-n) is the first voltage source 210, m is n. Then, the expected value of the first current may be or approximately be $I_C$*n. As another example, if the voltage source of the total coil arrays (i.e., all of the one or more coil arrays 290-1, 290-2, ..., 290-n) is the second voltage source 220, m is 0. Then, the expected value of the first current may be zero or approximately zero. It should be noted that when the voltage source of an additional coil array is changed to the first voltage source 210, the first current may increase by an increment. The increment may be the same as or substantially the same as $I_C$.

An expected value of an electrical signal (e.g., the first current, the second current) acquired by a sampling circuit may refer to a value of the electrical signal when the tuning/detuning system is normal. The expected value of an electrical signal may be calculated or measured.

Figure 3:
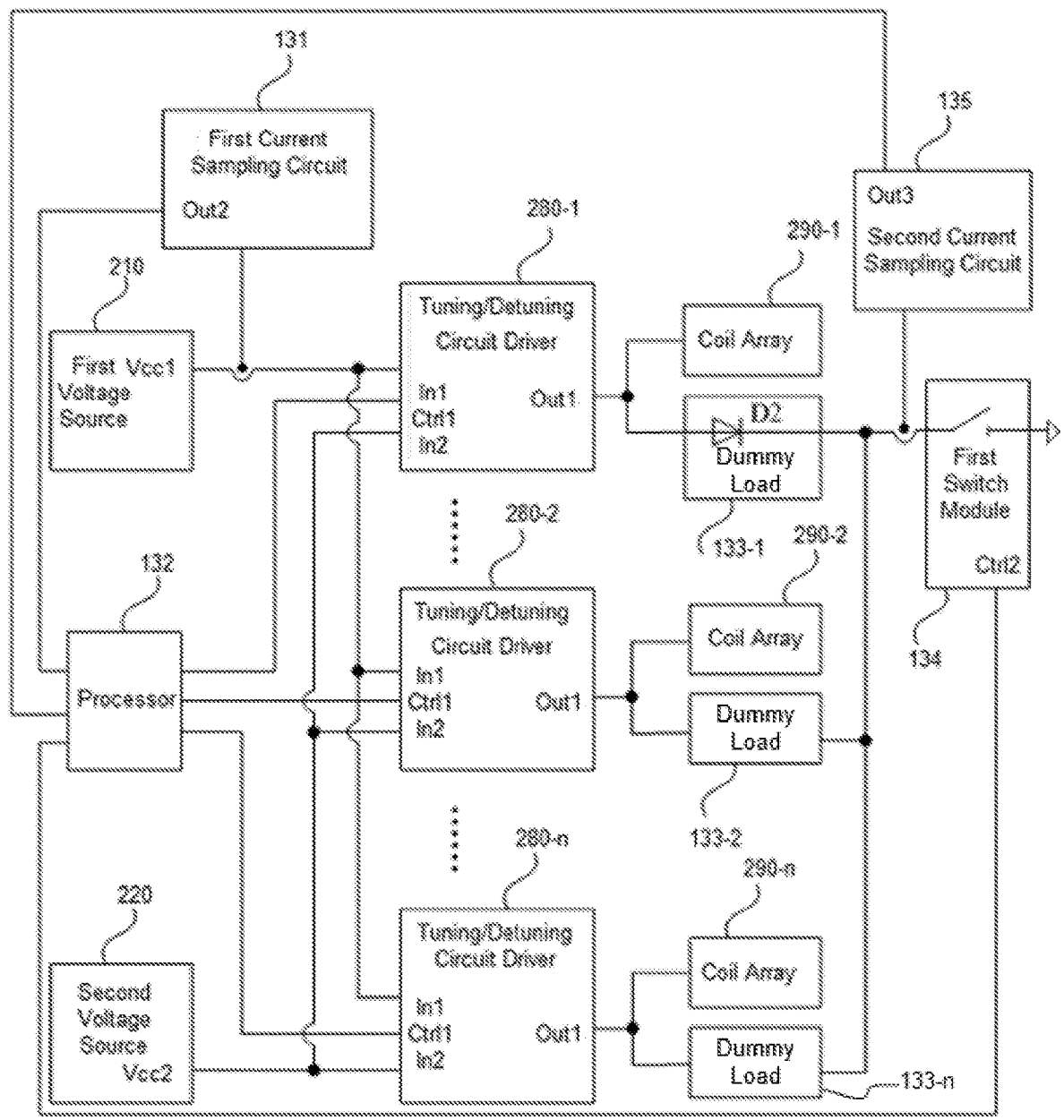
FIG. 3 illustrates an exemplary control system including a fault diagnosis circuit system for a tuning/detuning system according to some embodiments of the present disclosure.

FIG. 3 illustrates an exemplary control system 120 including a fault diagnosis circuit system for a tuning/detuning system according to some embodiments of the present disclosure. The exemplary control system 120 as illustrated in FIG. 3 may include the first voltage source 210, the second voltage source 220, the processor 132, the first current sampling circuit 131, the one or more tuning/detuning circuit driver 280-1, 280-2, ..., 280-n, and the one or more coil array 290-1, 290-2, ..., 290-n, similar to those illustrated in FIG. 2, the descriptions of which are not repeated here. Further, the exemplary control system 120 as illustrated in FIG. 3 may include one or more dummy loads 133-1, 133-2, ..., 133-n, a first switch module 134, and a second current sampling circuit 135.

A dummy load (e.g., 133-1, 133-2, ..., 133-n) may correspond to a tuning/detuning circuit driver (e.g., 280-1, 280-2, ..., 280-n). A dummy load (e.g., 133-1, 133-2, ..., 133-n) may correspond to a coil array (e.g., 290-1, 290-2, ..., 290-n). One end of a dummy load may be electrically connected to the output end Out1 of the corresponding tuning/detuning circuit driver. The other end of the dummy load may be electrically connected to a common connecting end to a first switch module 134. A dummy load (e.g., 133-1, 133-2, ..., 133-n) may include one or more diodes D2. For simplicity, only one diode D2 is illustrated only in the dummy load 133-1. It is understood that other dummy loads 133-2, ..., 133-n, as well as the dummy load 133-1, may also include one or more diodes D2. One end of the one or more diodes D2 may be electrically connected to the output end Out1 of the corresponding tuning/detuning circuit driver. The other end of the one or more diodes D2 may be electrically connected to the common connecting end to the first switch module 134.

The first switch module 134 may include a first end, a second end, and a control end Ctrl2. The first end may be electrically connected to the common connecting end of the dummy loads. The second end may be electrically connected to the ground. The control end Ctrl2 may be operatively connected to the processor 132. In some embodiments, the first switch module 134 may be a switch, a relay, or the like, or the combination thereof.

Accordingly, the processor 132 may command the first switch module 134 through the control end Ctrl2. In some embodiments, the processor 132 may cause the first switch module 134 to turn on by transmitting a high signal voltage. Thus, the one or more dummy loads 133-1, 133-2, ..., 133-n may be electrically connected to the control system 120. In some embodiments, the processor 132 may cause the first switch module 134 to turn off by transmitting a low signal voltage. Thus, the one or more dummy loads 133-1, 133-2, ..., 133-n may be electrically disconnected from the diagnosis circuit system. The one or more coil arrays 290-1, 290-2, ..., 290-n and the one or more dummy loads 133-1, 133-2, ..., 133-n may not be electrically connected to the control system 120 at the same time. When the one or more coil arrays 290-1, 290-2, ..., 290-n are electrically connected to the control system 120, the processor 132 may perform fault diagnosis on the tuning/detuning system based on a comparison between an actual value and an expected value of an electrical signal. For example, the processor 132 may determine whether a short circuit and/or an open circuit exist in the tuning/detuning system based on a comparison between an actual value and an expected value of the first current. Upon a determination that a short circuit and/or an open circuit exists in the tuning/detuning system, the processor 132 may cause the first switch module 134 to turn on. Then the one or more dummy loads 133-1, 133-2, ..., 133-n may be electrically connected to the diagnosis circuit. The processor 132 may further determine an exact location in which the short/open circuit exists. For instance, the processor 132 may perform a comparison between an actual value and an expected value of the first current under one or more various circumstances. Merely by way of example, the processor 132 may determine that a short/open circuit exists in the one or more tuning/detuning circuit drivers 280-1, 280-2, ..., 280-n or the one or more coil arrays 290-1, 290-2, ..., 290-n. As another example, the processor 132 may determine which one of the one or more tuning/detuning circuit drivers 280-1, 280-2, ... 280-n and the one or more coil arrays 290-1, 290-2, ..., 290-n the short/open circuit exists in. More details regarding the fault diagnosis may be found elsewhere in the present disclosure. See, e.g., FIGS. 6 to 14.

The second current sampling circuit 135 may be configured to sample a second current. The second current may refer to a current outputted by the one or more dummy loads 133-1, 133-2, ..., 133-n and/or a current between the common connecting end of the dummy loads and the ground. The second current may be digitalized, for example, using an analog-to-digital converter (ADC) of the second current sampling circuit 135, which is illustrated below. The second current sampling circuit 135 may be operatively connected to the processor 132 and electrically connected to the first switch module 134. When the first switch module 134 turns on, the second current sampling circuit 135 may sample an actual value of the second current and output the actual value of the second current to the processor 132 through the output end Out3.

To facilitate the description of the tuning/detuning system and the fault diagnosis circuit system in the present disclosure, more descriptions are illustrated below. As illustrated in FIG. 3, the positive end of one end diode D2 may be electrically connected to the output end Out1 and the negative end of the other end diode D2 may be electrically connected to the ground. In some embodiments, if the processor 132 selects the first voltage source 210 as the voltage source of the tuning/detuning circuit driver, i.e., the processor 132 causes the tuning/detuning circuit driver to have the input end In1 as the input end of the tuning/detuning circuit driver through the control end Ctrl1, the output end Out1 may output a constant current to the corresponding dummy loads. In these embodiments, the diodes D2 in the corresponding dummy loads may conduct. Thus, a current passing through the corresponding dummy load may be the same or substantially the same as the constant current. Accordingly, an expected value of the second current may be determined based on the number of dummy loads whose voltage source is the first voltage source 210, as illustrated below:

$$I_2 = I_C \times k, \quad (2)$$

where $I_2$ may refer to the expected value of the second current, $I_C$ may refer to the constant current, and k may refer to the number of dummy loads whose voltage source is the first voltage source 210.

For example, if the voltage source of the total dummy loads (i.e., the one or more dummy loads 133-1, 133-2, ..., 133-n) is the first voltage source 210, k is n. Then, the expected value of the first current may be or approximately be $I_C*n$. As another example, if the voltage source of the total dummy loads (i.e., all of the one or more dummy loads 133-1, 133-2, ..., 133-n) is the second voltage source 220, k is 0. Then, the expected value of the second current may be zero or approximately zero. It should be noted that when the voltage source of an additional dummy load is changed to the first voltage source 210, the second current may increase by an increment. The increment may be the same as or substantially the same as $I_C$.

Figure 11:
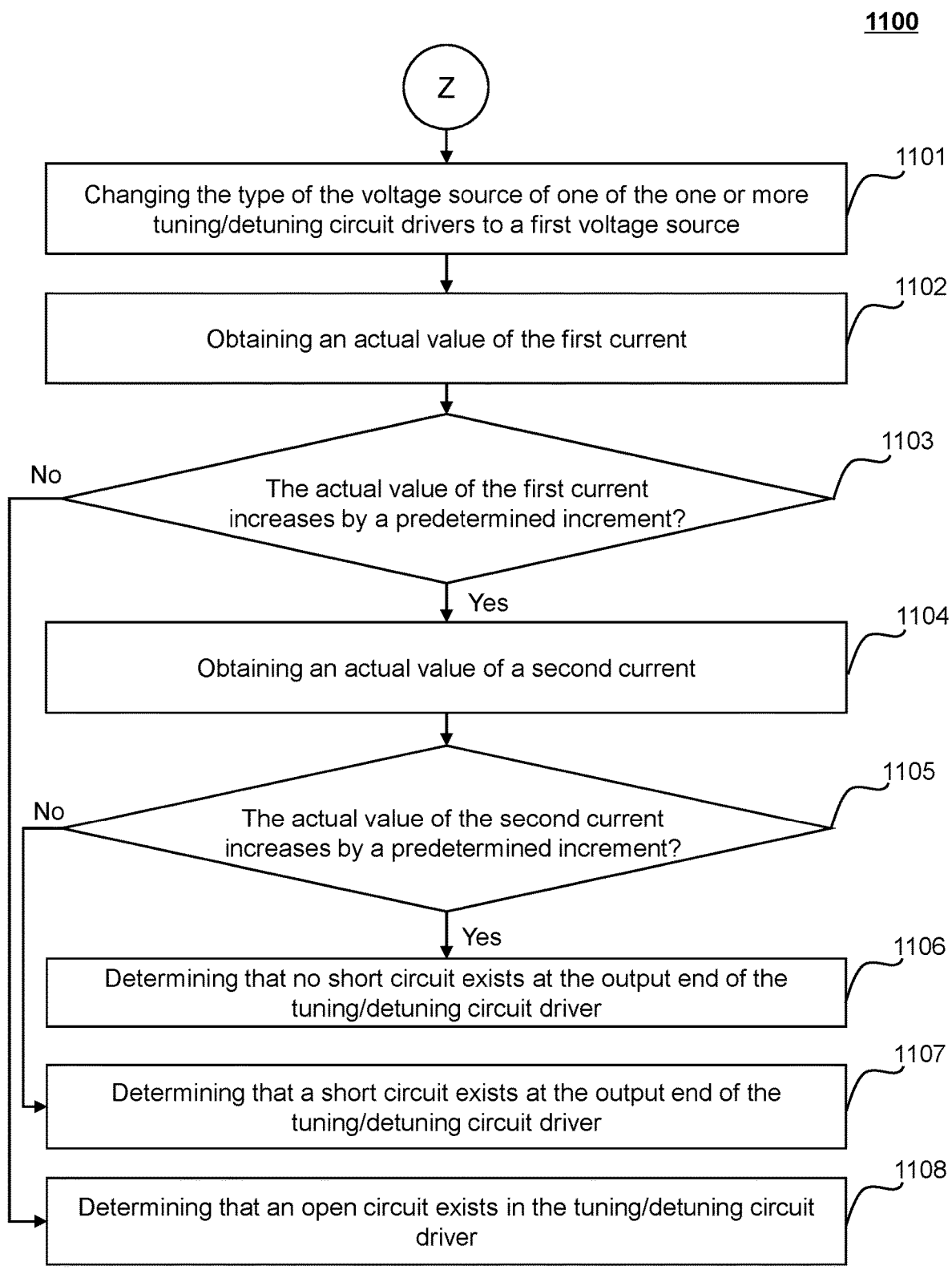
FIG. 11 illustrates an exemplary process for fault diagnosis of a tuning/detuning system based on the change of a first current and a second current according to some embodiments of the present disclosure.

Accordingly, the processor 132 may be configured to perform fault diagnosis on the one or more output ends Out1 of the one or more tuning/detuning circuit drivers 280-1, 280-2, ..., 280-n according to the second current. In some embodiments, the processor 132 may perform the fault diagnosis based on a comparison between an actual value and an expected value of the second current. FIG. 11 illustrates an exemplary process for fault diagnosis.

Figure 4:
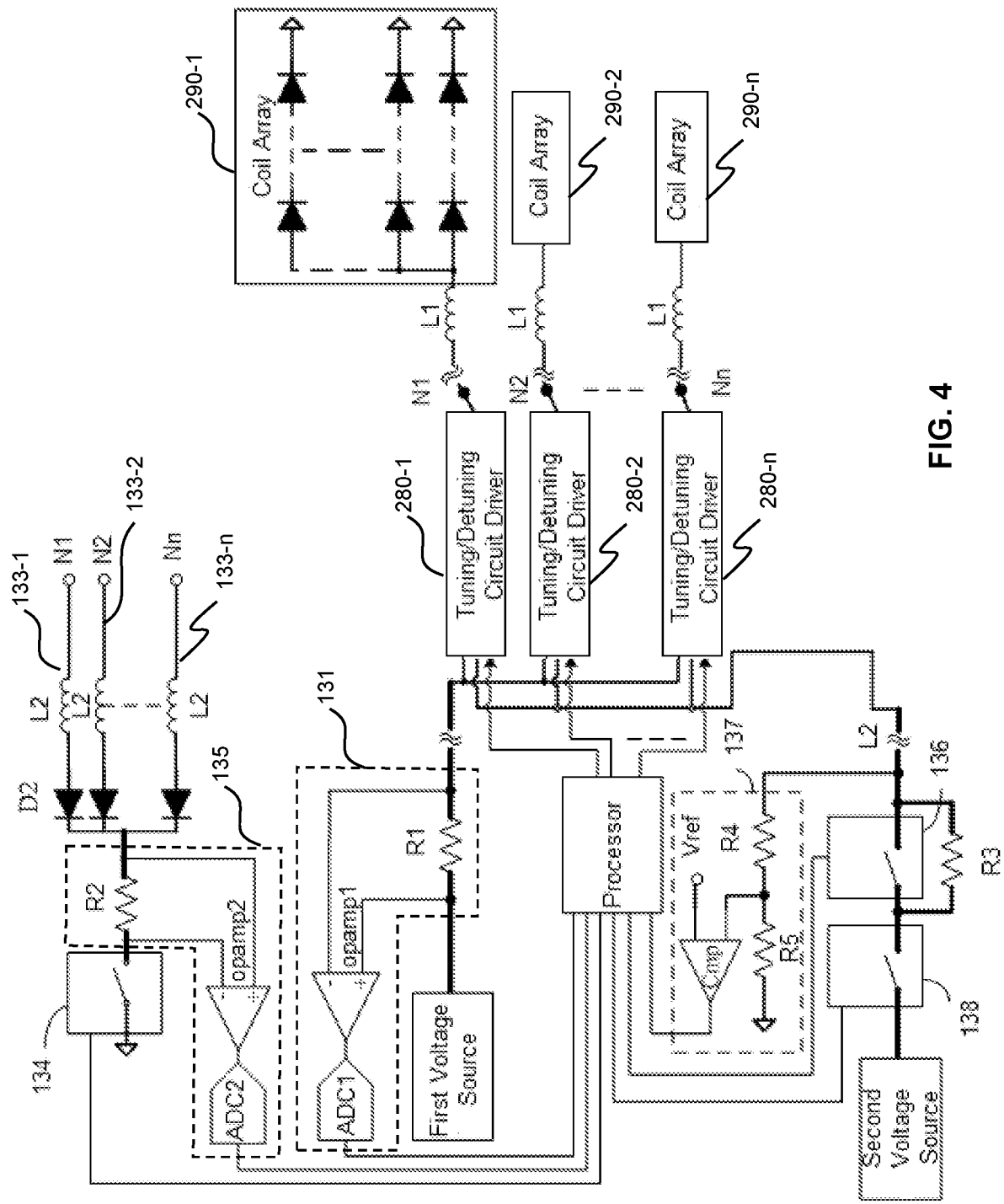
FIG. 4 illustrates an exemplary control system including a fault diagnosis circuit system for a tuning/detuning system according to some embodiments of the present disclosure.

FIG. 4 illustrates an exemplary control system 120 including a fault diagnosis circuit system for a tuning/detuning system according to some embodiments of the present disclosure. The exemplary control system 120 as illustrated in FIG. 4 may include the first voltage source 210, the second voltage source 220, the processor 132, the first current sampling circuit 131, the one or more tuning/detuning circuit driver 280-1, 280-2, ..., 280-n, the one or more coil array 290-1, 290-2, ..., 290-n, the one or more dummy loads 133-1, 133-2, ..., 133-n, the second current sampling circuit 135, and the first switch module 134, similar to those illustrated in FIGS. 2 and 3, the descriptions of which are not repeated here. It is understood that more details are illustrated in the coil array 290-1 than in the coils arrays 290-2, ..., 290-n for illustration purposes. The coils arrays 290-2, ..., 290-n may be the same as or different from the coil array 290-1, as described with reference to FIGS. 2 and 3. Further, the exemplary control system 120 as illustrated in FIG. 4 may include a current limit resistor R3, a second switch module 136, and a voltage comparison circuit 137.

The current limit resistor R3 may be electrically connected to the second switch module 136 in parallel. A first end of the current limit resistor R3 may be electrically connected to at least one of the input end(s) In2 of the one or more tuning/detuning circuit drivers 280-1, 280-2, ..., 280-n. A second end of the current limit resistor R3 may be electrically connected to the second voltage source 220. When the second switch module 136 turns off, the second voltage source 220 may be electrically connected to the one or more tuning/detuning circuit drivers 280-1, 280-2, ..., 280-n through the current limit resistor R3.

The second switch module 136 may include a first end, a second end, and a control end. The first end may be electrically connected to the output end Vcc2 of the second voltage source 220. The second end may be electrically connected to at least one of the one or more tuning/detuning circuit drivers 280-1, 280-2, ..., 280-n. The control end may be electrically connected to the processor 132. In some embodiments, the second switch module 136 may be a switch, a relay, or the like, or the combination thereof.

Accordingly, the processor 132 may command the second switch module 136 through the control end. For example, the processor 132 may cause the second switch module 136 to turn on by transmitting a high signal voltage. As another example, the processor 132 may cause the second switch module 136 to turn off by transmitting a low signal voltage. In some embodiments, when the control system 120 as illustrated in FIG. 4 is idle, the processor 132 may cause the second switch module 136 to turn off, and the processor 132 may further perform fault diagnosis on the one or more tuning/detuning circuit drivers. In some embodiments, when the control system 120 is performing a scan, the processor 132 may cause the second switch module 136 to turn on.

Figure 12:
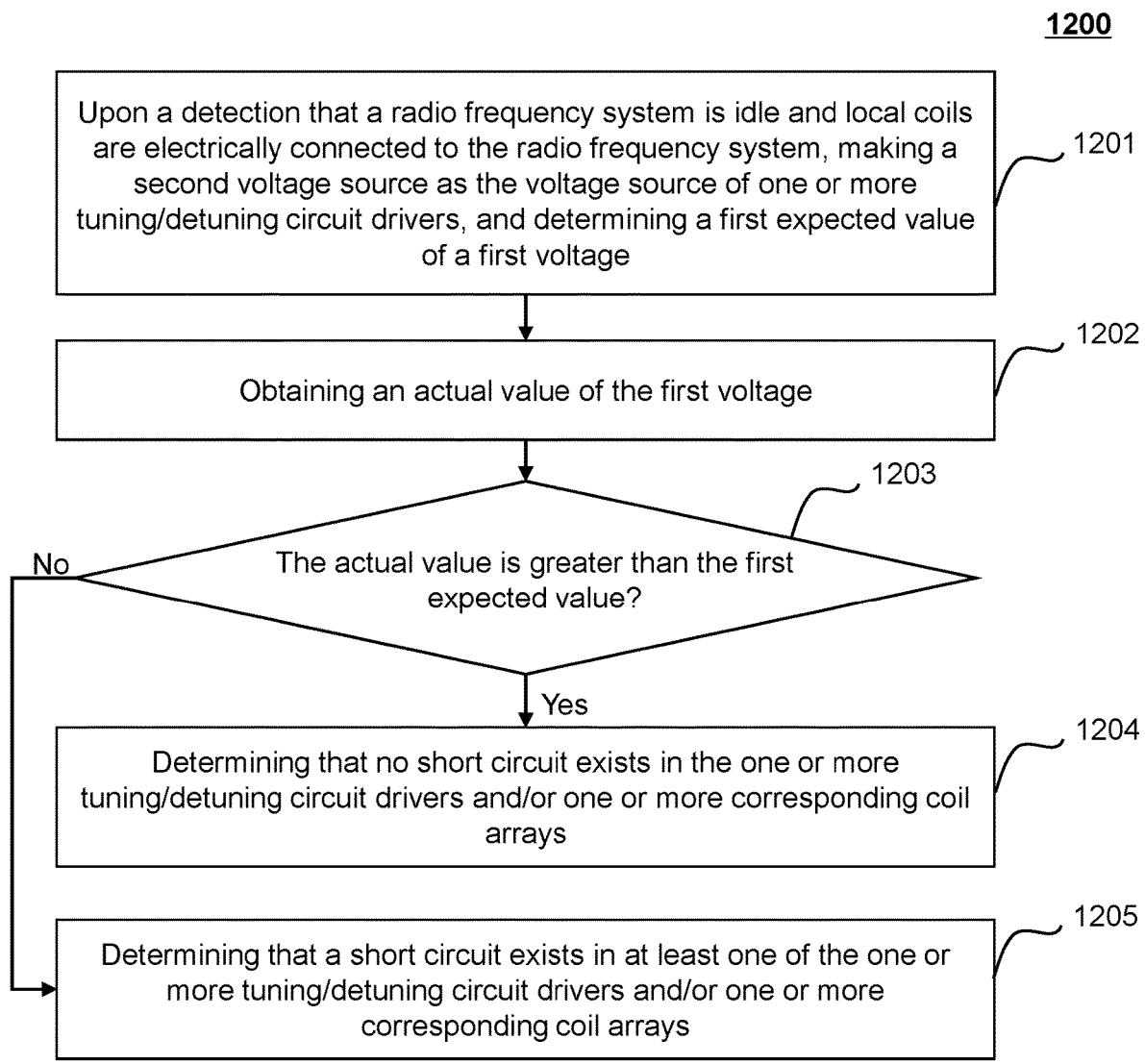
FIG. 12 illustrates an exemplary process for fault diagnosis of a tuning/detuning system based on a first voltage according to some embodiments of the present disclosure.
Figure 13:
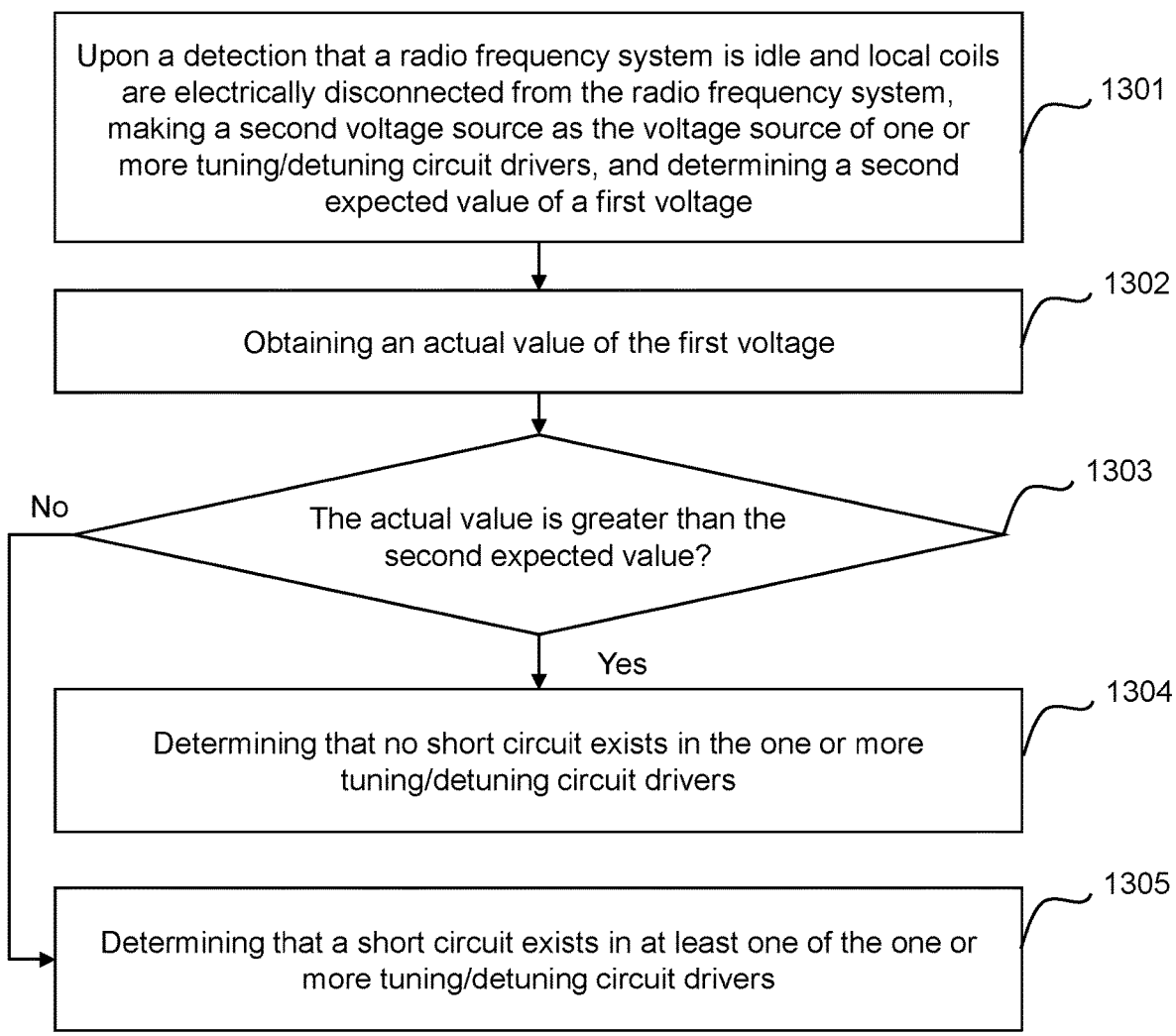
FIG. 13 illustrates an exemplary process for fault diagnosis of a tuning/detuning system based on a first voltage according to some embodiments of the present disclosure.

The voltage comparison circuit 137 may be configured to sample a first voltage and compare the first voltage and a reference voltage, as illustrated in equation (3). The first voltage may refer to a voltage outputted by the first end of the current limit resistor R3. The voltage comparison circuit 137 may include a voltage sampling end and an output end. The voltage sampling end may be electrically connected to the first end of the current limit resistor R3. The output end may be operatively connected to the processor 132. Accordingly, the processor 132 may perform fault diagnosis on the one or more tuning/detuning circuit drivers 280-1, 280-2, ..., 280-n based on the first voltage. In some embodiments, the processor 132 may perform the fault diagnosis based on a comparison between an actual value and an expected value of the first voltage. FIGS. 12 and 13 illustrate exemplary processes for the fault diagnosis.

In some embodiments, the control system 120 as illustrated in FIG. 4 may further include a third switch module 138. The third switch module 138 may include a first end, a second end, and a control end. The first end may be electrically connected to the output end Vcc2 of the second voltage source 220. The second end may be electrically connected to the current limit resistor R3. The control end may be operatively connected to the processor 132. In some embodiments, the third switch module 138 may be a switch, a relay, or the like, or the combination thereof. Accordingly, the processor 132 may command the third switch module 138 through the control end. For example, the processor 132 may cause the third switch module 138 to turn on by transmitting a high signal voltage. As another example, the processor 132 may cause the third switch module 138 to turn off by transmitting a low signal voltage. In some embodiments, when determining that short circuit exists in the tuning/detuning system of the local coils, the processor 132 may cause the third switch module 138 to turn off, thus protecting the tuning/detuning system.

In some embodiments, the tuning/detuning system of the local coils may further include one or more inductors L1 in addition to the first voltage source 210, the second voltage source 220, the one or more coil arrays 290-1, 290-2, ..., 290-n and the one or more tuning/detuning circuit drivers 280-1, 280-2, ..., 280-n that are illustrated in FIGS. 2 and 3. An inductor L1 may correspond to a coil array (e.g., 290-1, 290-2, ..., 290-n).

In some embodiments, a dummy load (e.g., 133-1, 133-2, ..., 133-n) may include a second inductor L2. The second inductor L2 may be electrically connected to the second diode D2 in series. A dummy load (e.g., 133-1, 133-2, ..., 133-n) may be electrically connected to a tuning/detuning circuit driver (e.g., 280-1, 280-2, ..., 280-n) through an electrical node (e.g., N1, N2, ..., Nn illustrated in FIG. 4). An electrical node may be electrically connected to another electrical node with the same mark. For example, the electrical node N1 on the dummy load 133-1 branch may be electrically connected to the electrical node N1 on the tuning/detuning circuit driver branch.

As illustrated in FIG. 4, the first current sampling circuit 131 may include a first sampling resistor R1, a first operational amplifier opamp1, and a first analog-to-digital converter ADC1. The first sampling resistor R1 may be electrically connected to the first voltage source 210 and at least one of the one or more tuning/detuning circuit drivers 280-1, 280-2, ..., 280-n. As illustrated, the first end of the first sampling resistor R1 may be electrically connected to the output end Vcc1 of the first voltage source 210. The second end of the first sampling resistor R1 may be electrically connected to at least one of the first input end(s) In1 of the one or more tuning/detuning circuit drivers 280-1, 280-2, ..., 280-n. At the same time, the first end of the first sampling resistor R1 may be electrically connected to the positive end of the first operational amplifier opamp1, and the second end of the first sampling resistor R1 may be electrically connected to the negative end of the first operational amplifier opamp1. The ADC1 may be operatively connected to the processor 132 and the first operational amplifier opamp1. As illustrated, the output end of the first operational amplifier opamp1 may be electrically connected to the input end of the ADC1, and the output end of the ADC1 may be operatively connected to the processor 132. The ADC1 may be configured to digitalize the first current. In some embodiments, the first sampling resistor R1 may be a power resistor, for example, a high precision power resistor.

The second current sampling circuit 135 may include a second sampling resistor R2, a second operational amplifier opamp2, and a second analog-to-digital converter ADC2. The second sampling resistor R2 may be electrically connected to the first switch module 134 in series. The first end of the second sampling resistor R2 may be electrically connected to the positive end of the second operational amplifier opamp2, and the second end of the second sampling resistor R2 may be electrically connected to the negative end of the second operational amplifier opamp2. The ADC2 may be operatively connected to the processor 132 and the second operational amplifier opamp2. As illustrated, the output end of the second operational amplifier opamp2 may be electrically connected to the input end of the ADC2, and the output end of the ADC2 may be operatively connected to the processor 132. The ADC2 may be configured to digitalize the second current.

The voltage comparison circuit 137 may include a fourth resistor R4, a fifth resistor R5, and a comparator Cmp. The first end of the fourth resistor R4 may be electrically connected to the voltage sampling end of the voltage comparison circuit 137, i.e., the first end of the current limit resistor R3. The second end of the fourth resistor R4 may be electrically connected to the first input end of the comparator Cmp. The first end of the fifth resistor R5 may be electrically connected to the first input end of the comparator Cmp. The second end of the fifth resistor R5 may be electrically connected to the ground. The second input end of the comparator Cmp may be electrically connected to a reference voltage Vref. The output end of the comparator Cmp may be operatively connected to the processor 132. The comparator Cmp may be configured to compare the first voltage and a reference voltage, which is illustrated below. See, e.g., equation (3) and the description thereof.

It should be noted that the exemplary constructions are merely provided for the purposes of illustration, and not intended to limit the scope of the present disclosure. The first current sampling circuit 131, the second current sampling circuit 135 and/or the voltage comparison circuit 137 may include other constructions.

Merely by way of example, when the control system 120 as illustrated in FIG. 4 is idle, the processor 132 may command the second switch module 136 to turn off. The comparator Cmp may compare the reference voltage Vref and the first voltage, and output a signal indicating a comparison result. Then, the processor 132 may perform the fault diagnosis on the tuning/detuning system based on the comparison result. The reference voltage Vref may fall within a range from $V_2 \times R_5/(R_4+R_5)$ to zero, as illustrated below:

$$V_{ref} \in (V_2 \times R_5/(R_4+R_5), 0), \quad (3)$$

where $V_2$ may refer to the constant negative voltage outputted by the second voltage source 220.

Since the second voltage source 220 outputs a constant negative voltage, when a short circuit does not exist in a tuning/detuning circuit driver whose voltage source is the second voltage source 220 and/or when a short circuit does not exist in the corresponding coil array, the first voltage sampled by the voltage comparison circuit 137 may be approximately the same as the constant negative voltage, i.e., $V_1 \approx V_2$. The comparator Cmp may output a signal indicating that the reference voltage is greater than the first voltage. On the other hand, when a short circuit exists in a tuning/detuning circuit driver whose voltage source is the second voltage source 220 and/or when a short circuit exists in the corresponding coil array, the voltage of the current limit resistor R3 may be approximately the same as the constant negative voltage. Thus, the first voltage sampled by the voltage comparison circuit 137 may increase to approximately zero, i.e., $V_1 \approx 0$. The comparator Cmp may output a signal indicating that the reference voltage is less than the first voltage. Therefore, the processor 132 may determine whether a short circuit exists in a tuning/detuning circuit driver and the corresponding coil array based on the signal outputted by the comparator Cmp.

FIG. 5 illustrates an exemplary first voltage source 210 according to some embodiments of the present disclosure.

As illustrated, the first voltage source 210 may include a DC-DC controller 211, a sixth resistor R6, and a variable resistor 212.

The DC-DC controller 211 may include an output end Out5 and a feedback input. The feedback input may include a VSENSE pin or other pins. The variable resistor 212 may include a first end, a second end, and a control end. The sixth resistor R6 may include a first end and a second end. The output end Out5 of the DC-DC controller 211 and the first end of the variable resistor 212 may be electrically connected to the output end Vcc1 of the first voltage source 210. The VSENSE pin of the DC-DC controller 211 and the second end of the variable resistor 212 may be electrically connected to the first end of the sixth resistor R6. The second end of the sixth resistor R6 may be electrically connected to the ground. The control end of the variable resistor 212 may be operatively connected to the processor 132.

Accordingly, the processor 132 may be configured to adjust the equivalent resistance value of the variable resistor 212 through the control end. In some embodiments, the processor 132 may adjust the equivalent resistance value of the variable resistor 212 according to the configuration(s) of coil array(s) in the detuning status. Further, the processor 132 may adjust the voltage outputted by the output end Vcc1 of the first voltage source 210.

The DC-DC controller 211 may be configured to convert a direct current voltage V+ to a needed direct current voltage and output the needed direct current voltage. The VSENSE pin may be configured to output a constant voltage. The voltage outputted by the first voltage source 210 may be illustrated below:

$$V_3 = (R_{eq} + R_6) V_h / R_6, \qquad (4)$$

where $V_3$ may refer to the voltage outputted by the first voltage source 210, $R_{eq}$ may refer to the equivalent resistance value of the variable resistor 212, the $V_h$ may refer to the constant voltage outputted by the VSENSE pin.

In some embodiments, the DC-DC controller 211 may further include an enable end EN. The enable end EN may be operatively connected to the processor 132 to retrieve signals from the processor 132. The signals may include an enable signal and a disable signal. The enable signal may cause the first voltage source 210 to output a positive voltage. The disable signal may cause the first voltage source 210 to stop outputting the positive voltage. For example, when determining that a fault (e.g., a short circuit, an open circuit) exists, the processor 132 may transmit the disable signal to the DC-DC controller 211 through the enable end EN. The disable signal may cause the DC-DC controller 211 to stop working. Thus, the first voltage source 210 may stop outputting the positive voltage. Merely by way of example, the model of the DC-DC controller 211 may be TPS54620.

The variable resistor 212 may include a plurality of resistors and a plurality of fourth switch modules. The processor 132 may cause a first fourth module to turn on/off by transmitting a high/low signal voltage to the control end of the fourth switch module. Thus, the processor 132 may adjust the equivalent resistance value of the variable resistor 212, and then adjust the output voltage of the first voltage source 210 accordingly. See, e.g., equation (4).

For the purposes of illustration, the variable resistor 212 may include a seventh resistor R7, an eighth resistor R8, a ninth resistor R9, a tenth resistor R10, a fourth switch module 213, a fourth switch module 214, a fourth switch module 215, and a fourth switch module 216. The seventh resistor R7 may be electrically connected to the fourth switch module 213. The fourth switch module 213 may be electrically connected to the eighth resistor R8 in series. The eighth resistor R8 may be electrically connected to the ninth resistor R9. The ninth resistor R9 may be electrically connected to the tenth resistor R10. The fourth switch module 214 may be electrically connected to a branch including the fourth switch module 213 and the eighth resistor R8. The fourth switch module 215 may be electrically connected to a branch including the fourth switch module 213, the eighth resistor R8, and the ninth resistor R9. The fourth switch module 216 may be electrically connected to a branch including the fourth switch module 213, the eighth resistor R8, the ninth resistor R9, and the tenth resistor R10. Then, the processor 132 may adjust the equivalent resistance value of the variable resistor 212 by controlling the fourth switch module 213, the fourth switch module 214, the fourth switch module 215, and the fourth switch module 215.

In some embodiments, the first voltage source 210 may further include a third inductor L3 and a first capacitor C1. One end of the third inductor L3 may be electrically connected to the output end Out5 of the DC-DC controller 211. The other end of the third inductor L3 may be electrically connected to one end of the first capacitor C1, one end of the variable resistor 212, and the output end Vcc1 of the first voltage source 210. The other end of the first capacitor C1 may be electrically connected to the ground. The combination of the third inductor L3 and the first capacitor C1, forming a passive filter, may be configured to filter out single tuning or double tuning harmonics from the voltage.

In order to decrease the power loss of the one or more tuning/detuning circuit drivers 280-1, 280-2, . . . , 280-n, it is desired to decrease the voltage of the one or more tuning/detuning circuit drivers 280-1, 280-2, . . . , 280-n. As illustrated in FIGS. 2 to 4, the voltage of the one or more tuning/detuning circuit drivers 280-1, 280-2, . . . , 280-n may be the difference between the output voltage of the first voltage source 210 and the voltage of the one or more coil arrays 290-1, 290-2, . . . , 290-n. Thus, it is desired to decrease the output voltage of the first voltage source 210. Then the processor 132 may determine the minimum value of the output voltage of the first voltage source 210. The minimum value of the output voltage of the first voltage source 210 may be determined based on the configuration(s) of the coil array(s). According to the configuration of a coil array, the processor 132 may determine the number of first diodes D1 in each branch of the coil array that is in the detuning status. Further, the processor 132 may determine the number of first diodes D1 in a branch that includes the most first diodes D1. Thus, the processor 132 may determine the minimum output voltage of the first voltage source 210. Merely by way of example, the minimum output voltage of the first voltage source 210 may be illustrated below:

$$V_{3min} = V_S + M \times V_d, \qquad (5)$$

where $V_{3min}$ may refer to the minimum output voltage of the first voltage source 210, $V_S$ may refer to the minimum voltage of the one or more tuning/detuning circuit drivers 280-1, 280-2, . . . , 280-n, $V_d$ may refer to the voltage of a first diode that is conducting, and M may refer to the number of first diodes in a branch that includes the most first diodes.

Figure 6:
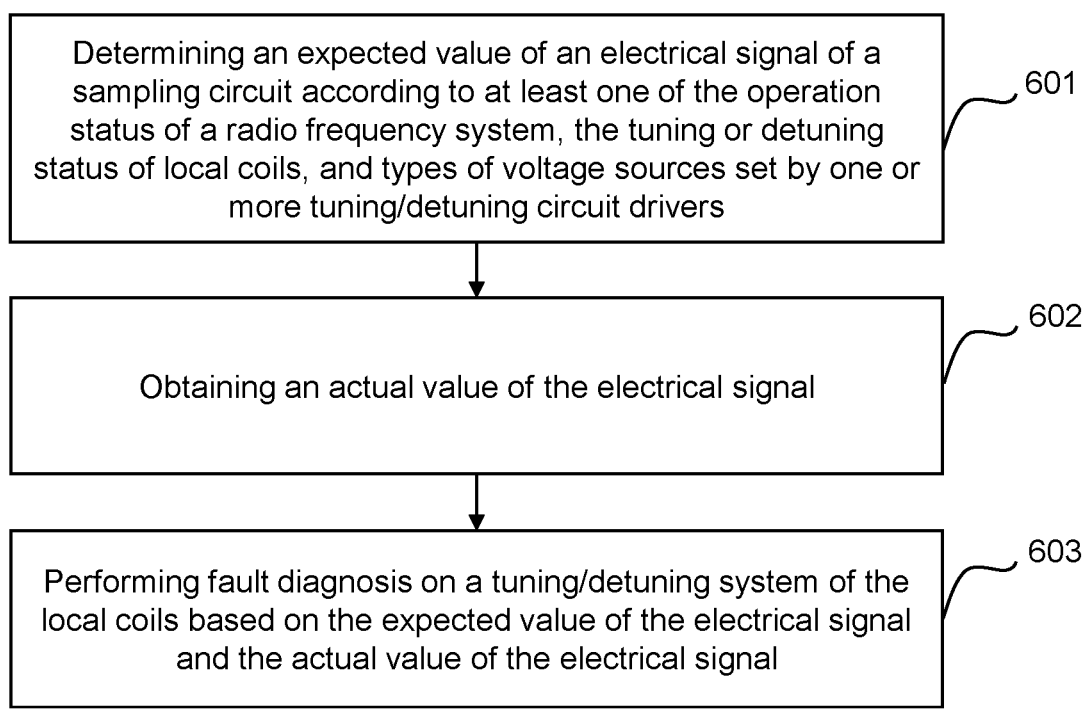
FIG. 6 illustrates an exemplary process for fault diagnosis of a tuning/detuning system according to some embodiments of the present disclosure.

FIG. 6 illustrates an exemplary process for fault diagnosis of a tuning/detuning system according to some embodiments of the present disclosure. Process 600 may be performed on the control system 120 as illustrated in FIGS. 2 to 4.

In 601, the processor 132 may determine an expected value of an electrical signal of a sampling circuit according to at least one of the operation status of the RF system 112, the tuning or detuning status of local coils, and the types of voltage sources set by the one or more tuning/detuning circuit drivers 280-1, 280-2, . . . , 280-n.

The operation status of the RF system 112 may include an idle status and a scanning status. When the RF system 112 is idle, the local coils may be electrically connected to the RF system 112 or not. When the RF system 112 is performing a scanning, the local coils may be electrically connected to the RF system 112. When the local coils are electrically connected to the RF system 112, the one or more coil arrays 290-1, 290-2, . . . , 290-n of the local coils may be electrically connected to the output ends Out1 of the one or more tuning/detuning circuit drivers 280-1, 280-2, . . . , 280-n. When the local coils are electrically disconnected from to the RF system 112, the one or more coil arrays 290-1, 290-2, . . . , 290-n of the local coils may be electrically disconnected from the output ends Out1 of the one or more tuning/detuning circuit drivers 280-1, 280-2, . . . , 280-n.

The types of voltage sources set by the one or more tuning/detuning circuit drivers 280-1, 280-2, . . . , 280-n may include the first voltage source 210 and the second voltage source 220.

The sampling circuit may include the first current sampling circuit 131, the second current sampling circuit 135, and the voltage comparison circuit 137. The electrical signal may include the first current sampled by the first current sampling circuit 131, the second current sampled by the second current sampling circuit 135, and the first voltage sampled by the voltage comparison circuit 137.

In some embodiments, the expected value of the first current may be determined based on the number of coil arrays whose voltage source is the first voltage source 210. For instance, the processor 132 may determine the expected value of the first current according to equation (1) described in connection with FIG. 2.

In some embodiments, the expected value of the second current may be determined based on the number of coil arrays whose voltage source is the first voltage source 210. For instance, the processor 132 may determine the expected value of the second current according to equation (2) described in connection with FIG. 3.

In some embodiments, the expected value of the first voltage may be approximately the same as the constant negative voltage outputted by the second voltage source 220. The processor 132 may determine the expected value of the first voltage according to the descriptions of FIG. 4.

In 602, the processor 132 may obtain an actual value of the electrical signal. In some embodiments, the processor 132 may obtain an actual value of the first current from the first current sampling circuit 131. In some embodiments, the processor 132 may obtain an actual value of the second current from the second current sampling circuit 135. In some embodiments, the processor 132 may obtain an actual value of the first voltage from the voltage comparison circuit 137.

In 603, the processor 132 may perform fault diagnosis on a tuning/detuning system of the local coils based on the expected value of the electrical signal and the actual value of the electrical signal. In some embodiments, the processor 132 may compare the expected value of the electrical signal and the actual value of the electrical signal. Further, the processor 132 may determine whether a fault exists in the tuning/detuning system according to the comparison. For example, upon the determination that the actual value is approximately the same as the expected value or that the difference between the actual value and the expected value is below a threshold, the processor 132 may determine that the tuning/detuning system is normal. As another example, upon the determination that the difference between the actual value and the expected value exceeds a threshold, the processor 132 may determine that a fault exists in the tuning/detuning system. The fault may include a short circuit and/or an open circuit.

It should be noted that the above description of process 600 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

Figure 7:
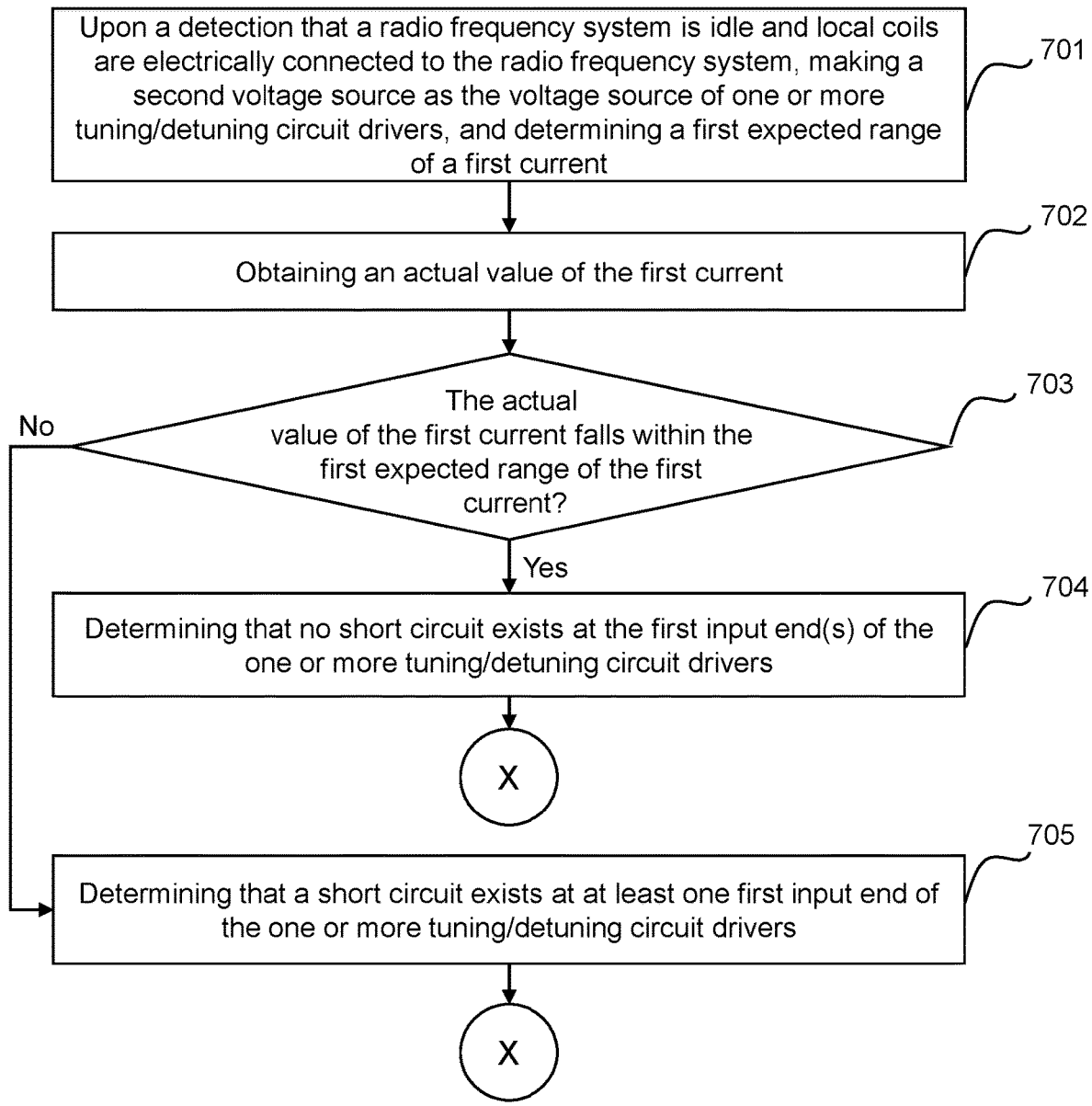
FIG. 7 illustrates an exemplary process for current based fault diagnosis of a tuning/detuning system based on a first current according to some embodiments of the present disclosure.

FIG. 7 illustrates an exemplary process for fault diagnosis of a tuning/detuning system based on the first current according to some embodiments of the present disclosure. Process 700 may be an example of the process 600. Process 700 may be performed on the control system 120 as illustrated in FIGS. 2 to 4.

In 701, upon the detection that the RF system 112 is idle and the local coils are electrically connected to the RF system 112, the processor 132 may cause the second voltage source 220 to serve as the voltage source of the one or more tuning/detuning circuit drivers 280-1, 280-2, . . . , 280-n. The processor 132 may determine a first expected range of the first current.

When the voltage source of the one or more tuning/detuning circuit drivers 280-1, 280-2, . . . , 280-n is the second voltage source 220, the number of the coil arrays whose voltage source is the first voltage source 210 is zero, i.e., m in equation (1) is zero. According to equation (1) illustrated in connection with FIG. 2, the expected value of the first current may be zero. Thus, the processor 132 may determine the first expected range of the first current as a range approaching zero. For example, the processor 132 may determine the first expected range of the first current as $(-I_{e1}, I_{e1})$. $I_{e1}$ may refer to a small positive number, for example, 0.1, 0.2.

It should be noted that for the control system 120 illustrated in FIGS. 3 and 4, when the local coils are electrically connected to the RF system 112, the one or more dummy loads 133-1, 133-2, . . . , 133-n are electrically disconnected from the RF system 112. Accordingly, the processor 132 may cause the first switch module 134 to turn off.

In 702, the processor 132 may obtain an actual value of the first current. As illustrated in FIGS. 2 to 4, the actual value of the first current may be sampled by the first current sampling circuit 131.

In 703, the processor 132 may determine whether the actual value of the first current falls within the first expected range of the first current. In some embodiments, the processor 132 may determine whether the actual value of the first current falls within $(-I_{e1}, I_{e1})$.

Upon the determination that the actual value of the first current falls within the first expected range of the first current, process 700 may proceed to 704. In 704, the processor 132 may determine that no short circuit exists at the first input end(s) of the one or more tuning/detuning circuit drivers 280-1, 280-2, . . . , 280-n.

Upon the determination that the actual value of the first current falls outside of the first expected range of the first current, process 700 may proceed to 705. In 705, the processor 132 may determine that a short circuit exists at the first input end(s) of the one or more tuning/detuning circuit drivers 280-1, 280-2, ..., 280-*n*.

Figure 8:
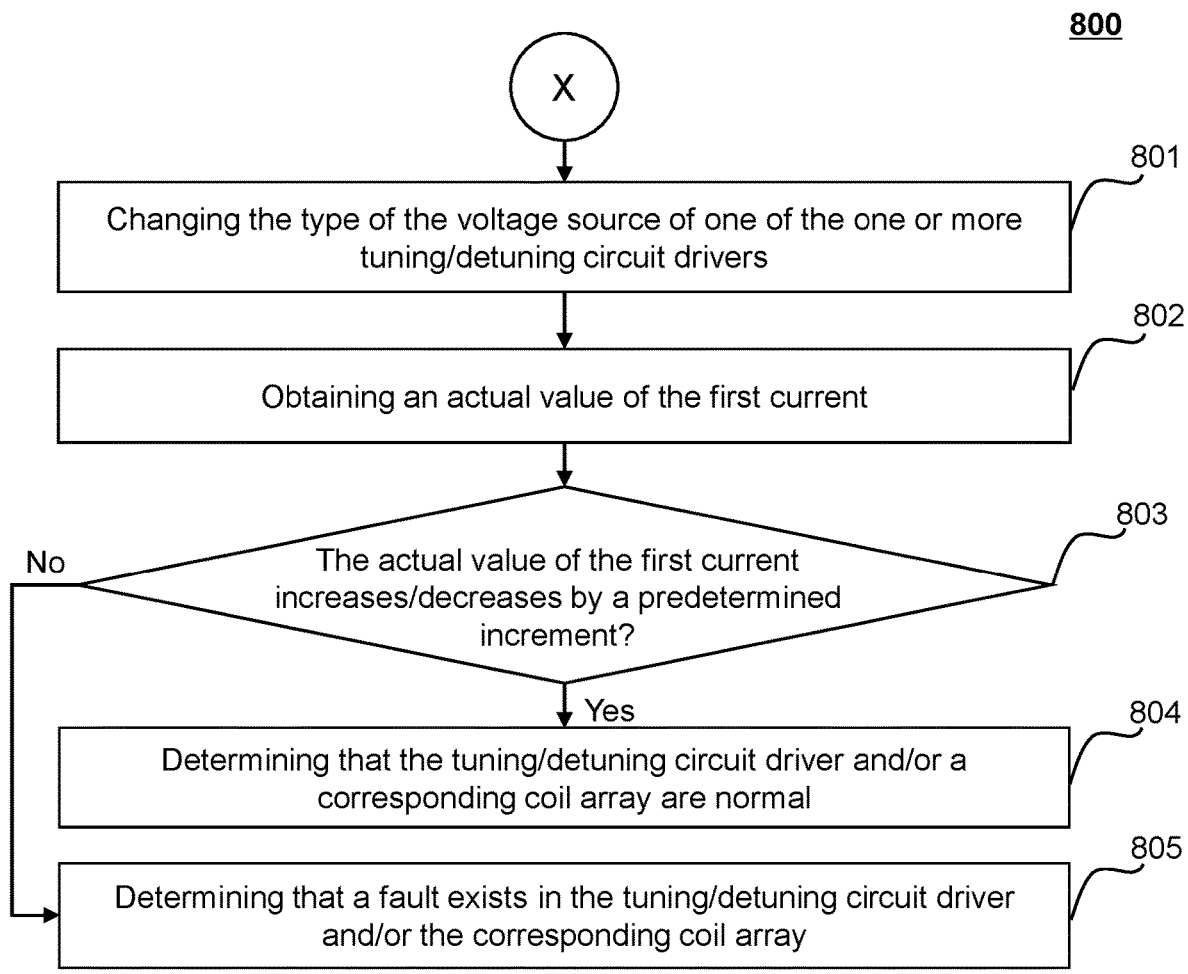
FIG. 8 illustrates an exemplary process for fault diagnosis of a tuning/detuning system based on the change of a first current according to some embodiments of the present disclosure.

After executing operations 704 and 705, the processor 132 may continue to perform operation X, which is illustrated in FIG. 8.

It should be noted that the above description of process 700 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

FIG. 8 illustrates an exemplary process for fault diagnosis of a tuning/detuning system based on a change of the first current according to some embodiments of the present disclosure. Process 800 may be performed on the control system 120 as illustrated in FIGS. 2 to 4.

In 801, the processor 132 may cause the type of the voltage source of one of the one or more tuning/detuning circuit drivers 280-1, 280-2, ..., 280-*n* to change. For instance, if the voltage source of a tuning/detuning circuit driver (e.g., 280-1, 280-2, ... 280-*n*) is originally the first voltage source 210, the processor 132 may cause it to change to the second voltage source 220. As another example, if the voltage source of a tuning/detuning circuit driver (e.g., 280-1, 280-2, ..., 280-*n*) is originally the second voltage source 220, the processor 132 may cause it to change to the first voltage source 210.

In 802, the processor 132 may obtain an actual value of the first current.

In 803, the processor 132 may determine whether the actual value of the first current increases/decreases by a predetermined increment in response to the change of the type of the voltage source of the tuning/detuning circuit driver.

Upon the determination that the actual value of the first current increases/decreases by a predetermined increment in response to the change of the type of the voltage source of the tuning/detuning circuit driver, process 800 may proceed to 804. In 804, the processor 132 may determine that the tuning/detuning circuit driver (e.g., 280-1, 280-2, ..., 280-*n*) and/or the corresponding coil array are normal.

Upon the determination that the actual value of the first current fails to increase/decrease by a predetermined increment, process 800 may proceed to 805. In 805, the processor 132 may determine that a fault exists in the tuning/detuning circuit driver (e.g., 280-1, 280-2, ..., 280-*n*) and/or the corresponding coil array.

Under different circumstances, process 800 may include different specific operations. Some examples of such specific operations of process 800 may be found below. It should be noted that the description below is merely for the purposes of illustration, and is not intended to be limiting.

In some embodiments, when the RF system 112 is idle and the local coils are electrically connected to the RF system 112, and the voltage source of the one or more tuning/detuning circuit drivers 280-1, 280-2, ..., 280-*n* is the second voltage source 220 (i.e., the embodiments illustrated in FIG. 7), in 801, the processor 132 may cause the voltage source of a tuning/detuning circuit driver to change to the first voltage source 210. The tuning/detuning circuit driver whose voltage source is changed may be any one of the one or more tuning/detuning circuit drivers 280-1, 280-2, ..., 280-*n*.

It should be understood that process 800 may be repeated many times, for example, for all the one or more tuning/detuning circuit drivers 280-1, 280-2, ..., 280-*n*. In each repetition, the voltage source of one tuning/detuning circuit driver may be changed to the first voltage source 210 or the second voltage source 220. In some embodiments, the processor 132 may change the type of the voltage source of the one or more tuning/detuning circuit drivers 280-1, 280-2, ..., 280-*n* one by one in an order. For example, the processor 132 may change the type of the voltage source of the one or more tuning/detuning circuits from the tuning/detuning circuit driver 280-1, the tuning/detuning circuit driver 280-2, to the tuning/detuning circuit driver 280-*n*. As another example, the processor 132 may change the type of the voltage source of the one or more tuning/detuning circuits from the tuning/detuning circuit driver 280-*n*, the tuning/detuning circuit driver 280-(*n*−1), to the tuning/detuning circuit driver 280-1.

When the voltage source of the tuning/detuning circuit driver is changed to the first voltage source 210, the number of coil arrays whose voltage source is the first voltage source 210 may increase by one. In some embodiments, before executing process 800 for a next tuning/detuning circuit driver, the processor 132 may cause the type of the voltage source of the tuning/detuning circuit driver that has been changed in the previous iteration of process 800 to change back from the first voltage source 210 to the second voltage source 220. Thus, each time process 800 is performed, the number of coil arrays whose voltage source is the first voltage source 210 may always be changed to one from zero. Accordingly, except for the tuning/detuning circuit driver whose voltage source is changed, the voltage source of the other tuning/detuning circuit drivers may remain to be the second voltage source 220. In some embodiments, before executing process 800 for a next tuning/detuning circuit driver, the processor 132 does not cause the type of the voltage source of the tuning/detuning circuit driver that has been changed in the previous iteration of process 800 to change back from the first voltage source 210 to the second voltage source 220. Accordingly, except for the tuning/detuning circuit driver whose voltage source is changed, the voltage source of the other tuning/detuning circuit drivers that have been changed in the previous iterations of process 800 may be allowed to remain changed (i.e., the voltage source of each of the other tuning/detuning circuit drivers remains the first voltage source 210). Thus, each time process 800 is performed, the number of coil arrays whose voltage source is the first voltage source 210 may increase by one, for example, from zero to one, from one to two, ..., from (n−1) to n. Accordingly, the expected value of the first current may always increase by Ic based on equation (1).

It should be noted that, in the present disclosure, the changing of the type of the voltage source of a tuning/detuning circuit driver may be performed in two ways as illustrated above. For brevity, in the following description, the two ways of the changing of the type of the voltage source are not illustrated separately.

Then, in 803, the processor 132 may determine whether the actual value of the first current increases by a predetermined increment. The predetermined increment may be set according to the change of the expected value of the first current, e.g., Ic. For instance, the predetermined increment may be a value closer to Ic. Merely by way of example, the predetermined increment may fall within a range centered at Ic, illustrated below:

$$D \in (I_C - \Delta I, I_C + \Delta I), \tag{6}$$

where D may refer to the predetermined increment, Ic may refer to the constant current outputted by the first voltage source 210, and ΔI may refer to a deviation of the current for a coil array. Such a deviation may be caused by, e.g., a tolerable fluctuation of the voltage source, a tolerable imperfection of the tuning/detuning circuit driver or the coil array, or the like, or a combination thereof.

In 804, upon the determination that the actual value of the first current increases by the predetermined increment (i.e., D), the processor 132 may determine that the tuning/detuning circuit driver and the corresponding coil array are normal. In 805, upon the determination that the actual value of the first current fails to increase by the predetermined increment (i.e., D), the processor 132 may determine that an open circuit exists in the tuning/detuning circuit driver and/or the corresponding coil array.

In some embodiments, when the RF system 112 is performing a scan and the local coils are electrically connected to the RF system 112 (i.e., the embodiments illustrated in FIG. 9), in 801, the processor 132 may change the voltage source of a tuning/detuning circuit driver whose voltage source is the second voltage source 220 to the first voltage source 210. When the voltage source of the tuning/detuning circuit driver is changed to the first voltage source 210, the number of coil arrays whose voltage source is the first voltage source 210 may increase by one. Accordingly, the expected value of the first current may increase by Ic based on equation (1). The predetermined increment may be the same as D illustrated in equation (6). Then, in 803, the processor 132 may determine whether the actual value of the first current increases by the predetermined increment (i.e., D). In 804, upon the determination that the actual value of the first current increases by the predetermined increment (i.e., D), the processor 132 may determine that the tuning/detuning circuit driver and the corresponding coil array are normal. In 805, upon the determination that the actual value of the first current fails to increase by the predetermined increment (i.e., D), the processor 132 may determine that an open circuit exists in the tuning/detuning circuit driver and/or the corresponding coil array.

Alternatively, in 801, the processor 132 may cause the voltage source of a tuning/detuning circuit whose voltage source is the first voltage source 210 to change to the second voltage source 220. When the voltage source of the tuning/detuning circuit driver is changed to the second voltage source 220, the number of coil arrays whose voltage source is the first voltage source 210 may decrease by one. Accordingly, the expected value of the first current may decrease by Ic based on equation (1). The predetermined increment may be the same as D illustrated in equation (6). Then, in 803, the processor 132 may determine whether the actual value of the first current decreases by the predetermined increment (i.e., D). In 804, upon the determination that the actual value of the first current decreases by the predetermined increment (i.e., D), the processor 132 may determine that the tuning/detuning circuit driver and the corresponding coil array are normal. In 805, upon the determination that the actual value of the first current fails to decrease by the predetermined increment (i.e., D), the processor 132 may determine that an open circuit exists in the tuning/detuning circuit driver and/or the corresponding coil array.

In some embodiments, when the RF system 112 is idle and the local coils are electrically disconnected from the RF system 112, and the voltage source of the one or more tuning/detuning circuit drivers 280-1, 280-2, ..., 280-n is the second voltage source 220 (i.e., the embodiments illustrated in FIG. 10), in 801, the processor 132 may cause the type of the voltage source of one of the one or more tuning/detuning circuit drivers 280-1, 280-2, ..., 280-n to change to the first voltage source 210. The number of dummy loads whose voltage source is the first voltage source 210 may increase by one. Accordingly, the expected value of the first current may increase by Ic. The predetermined increment may be the same as D illustrated in equation (6). Then, in 803, the processor 132 may determine whether the actual value of the first current increases by the predetermined increment (i.e., D). In 804, upon the determination that the actual value of the first current increases by the predetermined increment (i.e., D), the processor 132 may determine that no short circuit exists at the first input end of the tuning/detuning circuit driver. In 805, upon the determination that the actual value of the first current fails to increase by the predetermined increment (i.e., D), the processor 132 may determine that a short circuit exists at the first input end of the tuning/detuning circuit driver.

It should be noted that the above description of process 800 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

Figure 9:
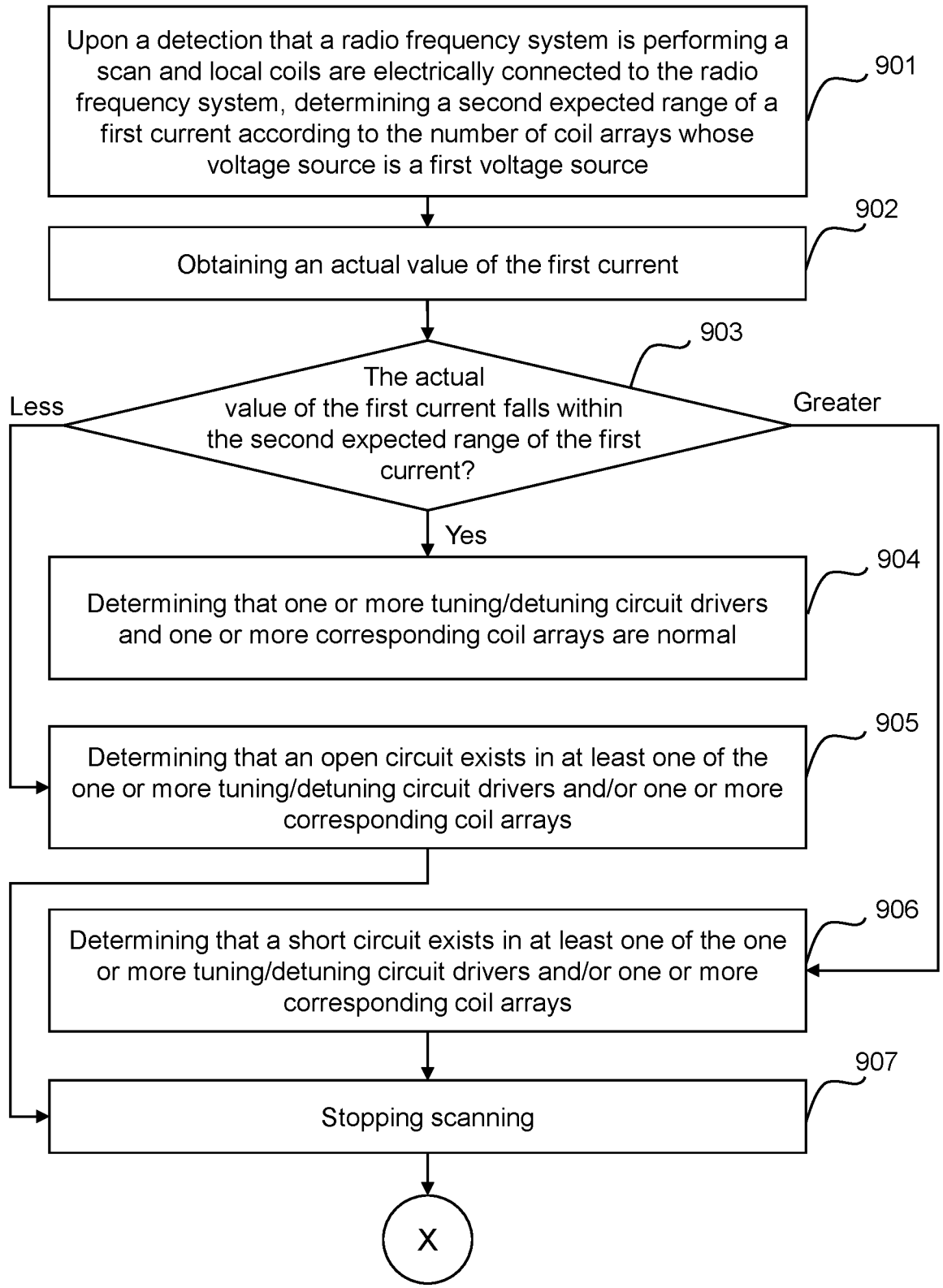
FIG. 9 illustrates an exemplary process for fault diagnosis of a tuning/detuning system based on a first current according to some embodiments of the present disclosure.

FIG. 9 illustrates an exemplary process for fault diagnosis of a tuning/detuning system based on the first current according to some embodiments of the present disclosure. Process 900 may be an example of the process 600. Process 900 may be performed on the control system 120 as illustrated in FIGS. 2 to 4.

In 901, upon the detection that the RF system 112 is performing a scan and the local coils are electrically connected to the RF system 112, the processor 132 may determine a second expected range of the first current according to the number of coil arrays whose voltage source is the first voltage source 210. When the RF system 112 is performing a scan, the status (e.g., a tuning status, a detuning status) of the one or more coil arrays 290-1, 290-2, ..., 290-n may be determined according to the needs of the scan. Thus, the types of the voltage sources of the one more coil arrays 290-1, 290-2, ..., 290-n may be determined according to the needs of the scan. Accordingly, the number of coil arrays whose voltage source is the first voltage source 210 may be determined according to the needs of the scan. According to equation (1) illustrated in connection with FIG. 2, the processor 132 may determine the expected value of the first current based on the number of coil arrays whose voltage source is the first voltage source 210. Then, the processor 132 may determine the second expected range of the first current according to the expected value of the first current.

Merely by way of example, the second expected range may be a range centered at the expected value of the first current, illustrated below:

$$(I_1 - \Delta I \times m, I_1 + \Delta I \times m), \tag{7}$$

where $I_1$ may refer to the expected value of the first current and be determined as $(I_C \times m)$ according to equation (1), m may refer to the number of coil arrays whose voltage source is the first voltage source 210, and ΔI may refer to a deviation of the current for a coil array.

In 902, the processor 132 may obtain an actual value of the first current. As illustrated in FIGS. 2 to 4, the actual value of the first current may be sampled by the first current sampling circuit 131.

In 903, the processor 132 may determine whether the actual value of the first current falls within the second expected range of the first current. In some embodiments, the processor 132 may determine whether the actual value of the first current falls within ($I_1-\Delta I \times m$, $I_1+\Delta I \times m$). Upon the determination that the actual value of the first current falls within the second expected range of the first current, process 900 may proceed to 904. In 904, the processor 132 may determine that the one or more tuning/detuning circuit drivers 280-1, 280-2, . . . , 280-n and the one or more corresponding coil arrays 290-1, 290-2, . . . , 290-n are normal.

Upon the determination that the actual value of the first current is lower than the lower limit of the second expected range of the first current, process 900 may proceed to 905. In 905, the processor 132 may determine that an open circuit exists in at least one of the one or more tuning/detuning circuit drivers 280-1, 280-2, . . . , 280-n and/or the one or more corresponding coil arrays 290-1, 290-2, . . . , 290-n.

Upon the determination that the actual value of the first current is greater than the upper limit of the second expected range of the first current, process 900 may proceed to 906. In 906, the processor 132 may determine that a short circuit exists in at least one of the one or more tuning/detuning circuit drivers 280-1, 280-2, . . . , 280-n and/or the one or more corresponding coil arrays 290-1, 290-2, . . . , 290-n.

After executing operations 905 and 906, the processor 132 cause the RF system 112 to stop scanning. Then the processor 132 may continue to perform operation X, which is illustrated in FIG. 8.

It should be noted that the above description of process 900 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

Figure 10:
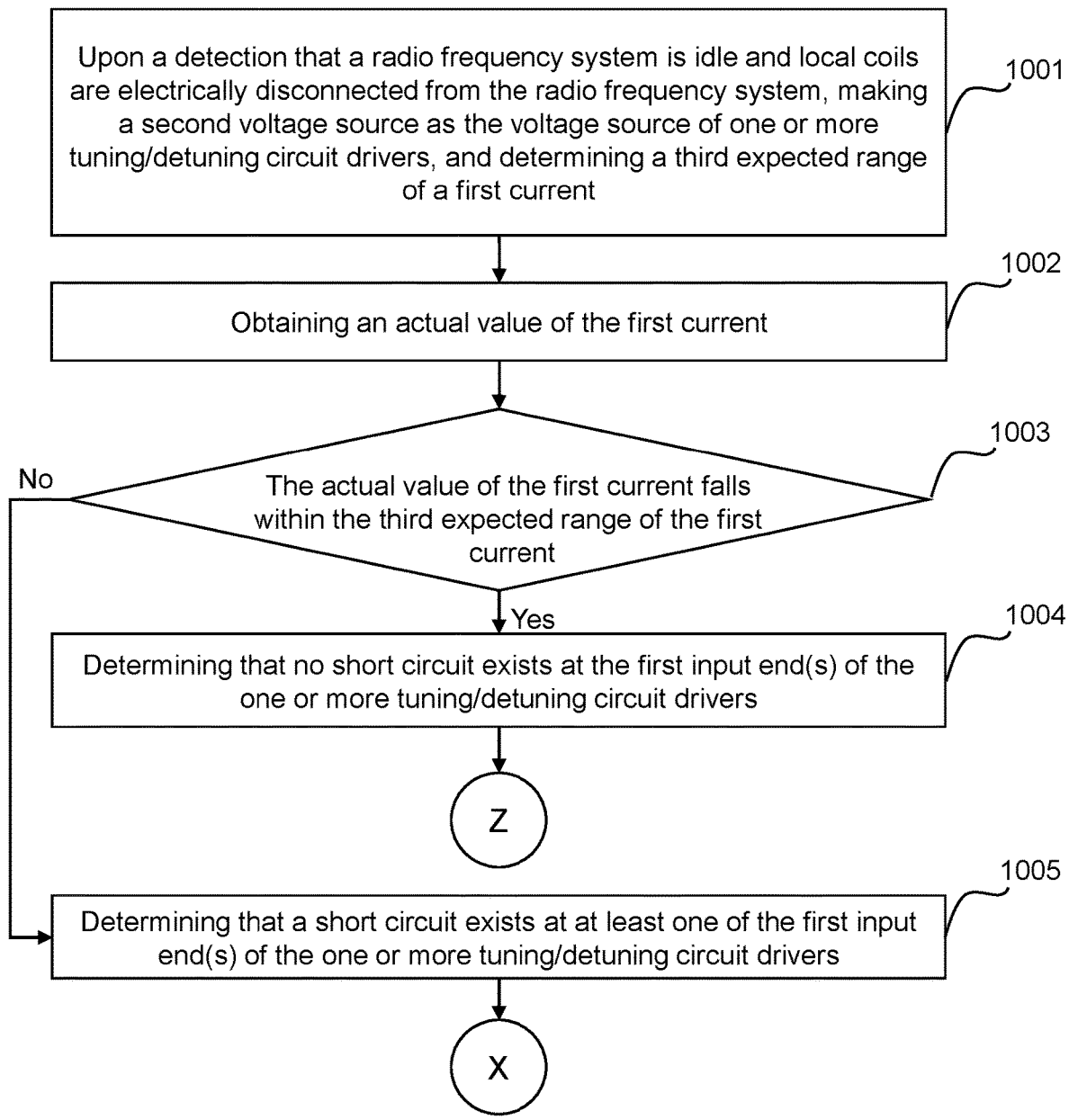
FIG. 10 illustrates an exemplary process for fault diagnosis of a tuning/detuning system based on a first current according to some embodiments of the present disclosure.

FIG. 10 illustrates an exemplary process for fault diagnosis of a tuning/detuning system based on the first current according to some embodiments of the present disclosure. Process 1000 may be an example of the process 600. Specifically, process 1000 may be an exemplary process for the fault diagnosis of the one or more dummy loads 133-1, 133-2, . . . , 133-n. Process 1000 may be performed on the control system 120 as illustrated in FIGS. 3 and 4.

In 1001, upon the detection that the RF system 112 is idle and the local coils are electrically disconnected from the RF system 112, the processor 132 may cause the second voltage source 220 to serve as the voltage source of the one or more tuning/detuning circuit drivers 280-1, 280-2, . . . , 280-n. The processor 132 may determine a third expected range of the first current.

Since the local coils are electrically disconnected from the RF system 112, the processor 132 may cause the first switch module 134 to turn on. Thus, the one or more dummy loads 133-1, 133-2, . . . , 133-n may be electrically connected to the RF system 112. In this case, the voltage source of the one or more dummy loads 133-1, 133-2, . . . , 133-n may be the second voltage source 220, and the number of dummy loads whose voltage source is the first voltage source 210 is zero. The expected value of the first current may be zero. Thus, the processor 132 may determine the third expected range of the first current as a range approaching zero. In some embodiments, the processor 132 may determine the third expected range of the first current as the same as the first expected range of the first current, for example, ($-I_{e1}$, $I_{e1}$). $I_{e1}$ may refer to a small positive number, for example, 0.1, 0.2.

In 1002, the processor 132 may obtain an actual value of the first current. As illustrated in FIGS. 2 and 3, the actual value of the first current may be sampled by the first current sampling circuit 131.

In 1003, the processor 132 may determine whether the actual value of the first current falls within the third expected range of the first current. In some embodiments, the processor 132 may determine whether the actual value of the first current falls within ($-I_{e1}$, $I_{e1}$).

Upon the determination that the actual value of the first current falls within the third expected range of the first current, process 1000 may proceed to 1004. In 1004, the processor 132 may determine that no short circuit exists at the first input end(s) of the one or more tuning/detuning circuit drivers 280-1, 280-2, . . . , 280-n. After executing operation 1004, the processor 132 may continue to perform operation Z, which is illustrated in FIG. 11.

Upon the determination that the actual value of the first current falls outside of the third expected range of the first current, process 1000 may proceed to 1005. In 1005, the processor 132 may determine that a short circuit exists at at least one of the first input end(s) of the one or more tuning/detuning circuit drivers 280-1, 280-2, . . . , 280-n. After executing operation 1005, the processor 132 may continue to perform operation X, which is illustrated in FIG. 8.

It should be noted that the above description of process 1000 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

FIG. 11 illustrates an exemplary process for fault diagnosis of a tuning/detuning system based on a change of the first current and the second current according to some embodiments of the present disclosure. Process 1100 may be performed on the control system 120 as illustrated in FIGS. 3 and 4.

In 1101, the processor 132 may cause the type of the voltage source of one of the one or more tuning/detuning circuit drivers 280-1, 280-2, . . . , 280-n to change to the first voltage source 210. Accordingly, the number of dummy loads whose voltage source is the first voltage source 210 may increase by one. Accordingly, the expected value of the first current may increase by Ic according to equation (1).

In 1102, the processor 132 may obtain an actual value of the first current after the changing. The actual value of the first current may be sampled by the first current sampling circuit 131.

In 1103, the processor 132 may determine whether the actual value of the first current after the changing increases by a predetermined increment. The predetermined increment for the first current may be determined according to equation (6). In some embodiments, the processor 132 may determine whether the actual value of the first current increases by D.

Upon the determination that the actual value of the first current fails to increase by the predetermined increment (e.g., D), process 1100 may proceed to 1108. In 1108, the processor 132 may determine that an open circuit exists in the tuning/detuning circuit driver (e.g., 280-1, 280-2, . . . , 280-n).

Upon the determination that the actual value of the first current increases by the predetermined increment (e.g., D), process 1100 may proceed to 1104. In 1104, the processor 132 may obtain an actual value of the second current. The actual value of the second current may be sampled by the second current sampling circuit 135.

In 1105, the processor 132 may determine whether the actual value of the second current increases by a predetermined increment. Since the number of dummy loads whose voltage source is the first voltage source 210 increases by one, the actual value of the second current may increase by $I_C$ according to equation (2). Thus, in some embodiments, the predetermined increment of the second current may be the same as D illustrated in equation (6).

Upon the determination that the actual value of the second current increases by the predetermined increment (e.g., D), process 1100 may proceed to 1106. In 1106, the processor 132 may determine that no short circuit exists at the output end of the tuning/detuning circuit driver (e.g., 280-1, 280-2, ..., 280-n).

Upon the determination that the actual value of the second current fails to increase by the predetermined increment (e.g., D), process 1100 may proceed to 1107. In 1107, the processor 132 may determine that a short circuit exists at the output end of the tuning/detuning circuit driver (e.g., 280-1, 280-2, ..., 280-n).

It should be noted that the above description of process 1100 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

FIG. 12 illustrates an exemplary process for fault diagnosis of a tuning/detuning system based on the first voltage according to some embodiments of the present disclosure. Process 1200 may be an example of the process 600. Process 1200 may be performed on the control system 120 as illustrated in FIG. 4.

In 1201, upon the detection that the RF system 112 is idle and the local coils are electrically connected to the RF system 112, the processor 132 may cause the second voltage source 220 to serve as the voltage source of the one or more tuning/detuning circuit drivers 280-1, 280-2, ..., 280-n. In some embodiments, the processor 132 may cause the second switch module 136 to turn off, thus, the current limit resistor R3 may be electrically connected to the RF system 112. The processor 132 may determine a first expected value of the first voltage. As illustrated in FIG. 4, the first expected value of the first voltage may be approximately the same as the constant negative voltage outputted by the second voltage source 220 (i.e., $V_2$).

In 1202, the processor 132 may obtain an actual value of the first voltage. The first voltage may be sampled by the voltage comparison circuit 137.

In 1203, the processor 132 may determine whether the actual value is greater than the first expected value. In some embodiments, the processor 132 may determine whether the actual value of the first voltage is greater than $V_2$.

Upon the determination that the actual value is greater than the first expected value (e.g., $V_2$), process 1200 may proceed to 1204. In 1204, the processor 132 may determine that no short circuit exists in the one or more tuning/detuning circuit drivers 280-1, 280-2, ..., 280-n and/or one or more corresponding coil arrays 290-1, 290-2, ... 290-n.

Upon the determination that the actual value is not greater than the first expected value (e.g., $V_2$), process 1200 may proceed to 1205. In 1205, the processor 132 may determine that a short circuit exists in at least one of the one or more tuning/detuning circuit drivers 280-1, 280-2, ..., 280-n and one or more corresponding coil arrays 290-1, 290-2, ..., 290-n.

It should be noted that the above description of process 1200 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

FIG. 13 illustrates an exemplary process for fault diagnosis of a tuning/detuning system based on the first voltage according to some embodiments of the present disclosure. Process 1300 may be an example of the process 600. Process 1300 may be performed on the control system 120 as illustrated in FIG. 4.

In 1301, upon the detection that the RF system 112 is idle and the local coils are electrically disconnected from the RF system 112, the processor 132 may cause the second voltage source 220 to serve as the voltage source of the one or more tuning/detuning circuit drivers 280-1, 280-2, ..., 280-n. In some embodiments, the processor 132 may cause the second switch module 136 to turn off so that the current limit resistor R3 may be electrically connected to the RF system 112. The processor 132 may determine a second expected value of the first voltage. The second expected value of the first voltage may be the same as the first expected value of the first voltage. As illustrated in FIG. 4, the second expected value of the first voltage may be approximately the same as the constant negative voltage outputted by the second voltage source 220 (i.e., $V_2$).

In 1302, the processor 132 may obtain an actual value of the first voltage. The first voltage may be sampled by the voltage comparison circuit 137.

In 1303, the processor 132 may determine whether the actual value is greater than the second expected value. In some embodiments, the processor 132 may determine whether the actual value of the first voltage is greater than $V_2$.

Upon the determination that the actual value is greater than the second expected value (e.g., $V_2$), process 1300 may proceed to 1304. In 1304, the processor 132 may determine that no short circuit exists in the one or more tuning/detuning circuit drivers 280-1, 280-2, ..., 280-n.

Upon the determination that the actual value is not greater than the second expected value (e.g., $V_2$), process 1300 may proceed to 1305. In 1305, the processor 132 may determine that a short circuit exists in at least one of the one or more tuning/detuning circuit drivers 280-1, 280-2, ..., 280-n.

It should be noted that the above description of process 1300 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

Figure 14:
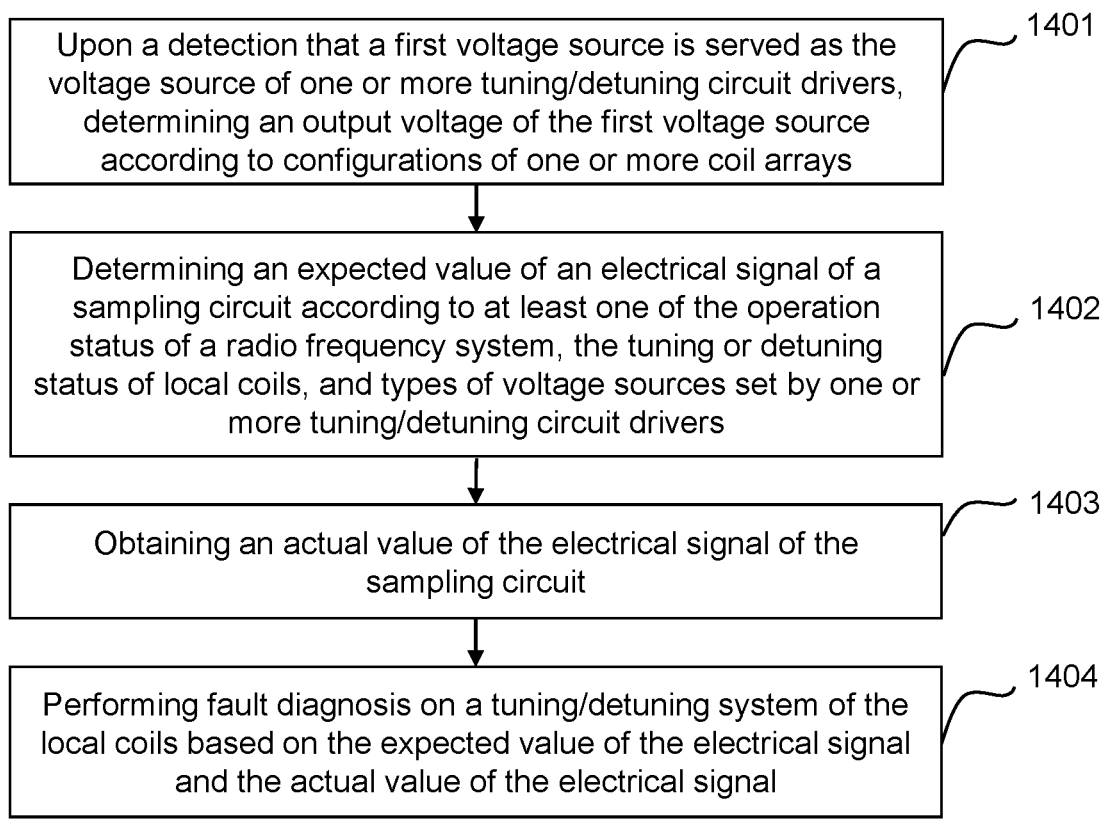
FIG. 14 illustrates an exemplary process for fault diagnosis of a tuning/detuning system based on the electrical signal according to some embodiments of the present disclosure.

FIG. 14 illustrates an exemplary process for fault diagnosis of a tuning/detuning system based on the electrical signal according to some embodiments of the present disclosure. Process 1400 may be an example of the process 600. Process 1400 may be performed on the control system 120 as illustrated in FIGS. 2 to 4.

In 1401, upon the detection that the first voltage source 210 is served as the voltage source of the one or more tuning/detuning circuit drivers 280-1, 280-2, . . . , 280-n, the processor 132 may determine an output voltage of the first voltage source 210 according to configurations of the one or more coil arrays 290-1, 290-2, . . . , 290-n.

Since the voltage source of the one or more tuning/detuning circuit drivers 280-1, 280-2, . . . , 280-n is the first voltage source 210, the one or more corresponding coil arrays 290-1, 290-2, . . . , 290-n may be in the detuning state. The processor 132 may determine the output voltage of the first voltage source 210 according to the configurations of the coil arrays in the detuning state, as illustrated in equation (5). Then, the processor 132 may change the output voltage of the first voltage source 210 by adjusting the equivalent resistance value of the variable resistor 212 (i.e., $R_{eq}$), as illustrated in equation (4).

In 1402, the processor 132 may determine an expected value of the electrical signal of the sampling circuit according to at least one of the operation status of the RF system 112, the tuning or detuning status of the local coils, and types of voltage sources set by the one or more tuning/detuning circuit drivers 280-1, 280-2, . . . , 280-n. The electrical signal may include the first current, the second current, the first voltage, etc. The sampling circuit may include the first current sampling circuit 131, the second current sampling circuit 135, the voltage comparison circuit 137, etc. FIG. 6 illustrates some exemplary operations for determining the expected value of the electrical signal.

In 1403, the processor 132 may obtain an actual value of the electrical signal of the sampling circuit. The processor 132 may obtain the actual value of the electrical signal by the first current sampling circuit 121, the second current sampling circuit 135, the voltage comparison circuit 137, etc.

In 1404, the processor 132 may perform fault diagnosis on the tuning/detuning system of the local coils based on the expected value of the electrical signal and the actual value of the electrical signal. In some embodiments, the processor 132 may compare the expected value of the electrical signal and the actual value of the electrical signal. The processor 132 may perform the fault diagnosis based on the comparison result. Details regarding the fault diagnosis may be found elsewhere in the present disclosure. See, e.g., FIGS. 7 to 13 and the descriptions thereof.

It should be noted that the above description of process 1400 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "block," "module," "engine," "unit," "component," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB. NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution—e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities of ingredients, properties such as molecular weight, reaction conditions, and so forth, used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

I claim:

1. A control system comprising:
a tuning/detuning system including a first voltage source, a second voltage source, a plurality of coil arrays, and a plurality of tuning/detuning circuit drivers corresponding to the plurality of coils arrays, respectively, wherein:
  the first voltage source, including a first output end, is configured to provide a power supply that outputs a constant current;
  the second voltage source, including a second output end, is configured to output a constant negative voltage;
  for each of the plurality of coil arrays,
    the coil array includes one or more first diodes; and
    the one or more first diodes determine a tuning or detuning status of the coil array;
  for each of the plurality of tuning/detuning circuit drivers,
    the tuning/detuning circuit includes a first input end, a second input end, a third output end, and a first control end;
    the first input end, electrically connected to the first output end of the first voltage source, serves as a positive power supply input port and is configured to output the constant current;
    the second input end, electrically connected to the second output end of the second voltage source, serves as a negative power supply input port and is configured to output the constant negative voltage; and
    the third output end, electrically connected to a corresponding coil array, is configured to output the constant current or the constant negative voltage that determines a conduction status of the one or more first diodes of the corresponding coil array; and
a diagnosis system including a first current sampling circuit and a processor, wherein:
  the first current sampling circuit, including a fourth output end, is configured to obtain a first current of the first output end of the first voltage source;
  the first current sampling circuit includes a first analog-to-digital converter (ADC), a first operational amplifier, and a first sampling resistor, wherein:
    the first ADC is electrically connected to the first operational amplifier in series and operatively connected to the processor,
    the first operational amplifier is electrically connected to the first sampling resistor in parallel, and
    the first sampling resistor is electrically connected to the first voltage source in series and electrically connected to at least one of the plurality of tuning/detuning circuit drivers in series; and
  the processor, operatively connected to the fourth output end and at least one of the plurality of first control ends corresponding to the plurality of tuning/detuning circuit drivers, is configured to determine the first input end or the second input end to be electrically connected to the third output end and to diagnose the tuning/detuning system based on the first current of the first output end of the first voltage source.

2. The control system of claim 1, wherein:
the diagnosis circuit system includes a first switch module and one or more dummy loads corresponding to the plurality of tuning/detuning circuit drivers, wherein:
each dummy load of the one or more dummy loads, including one or more second diodes, is electrically connected to a corresponding tuning/detuning circuit in parallel,
the one or more dummy loads are electrically connected to a common connecting end in parallel,
the first switch module is electrically connected to ground, electrically connected to the common connecting end, and operatively connected to the processor, and
the processor is configured to cause the first switch module to turn on or turn off, and to diagnose the tuning/detuning system based on the first current.

3. The control system of claim 2, wherein
the diagnosis circuit system includes a second current sampling circuit, wherein the second current sampling circuit, operatively connected to the processor, is configured to obtain a second current of the common connecting end, and
the processor is configured to diagnose the tuning/detuning system based on the second current.

4. The control system of claim 3, wherein the second current sampling circuit includes a second ADC, a second operational amplifier, and a second resistor, wherein:
the second ADC is electrically connected to the second operational amplifier in series and operatively connected to the processor,
the second operational amplifier is electrically connected to the second resistor in parallel, and
the second resistor is electrically connected to the first switch module in series and electrically connected to at least one of the one or more dummy loads in series.

5. The control system of claim 1, wherein:
the diagnosis circuit system includes a third resistor, a second switch module, and a voltage comparison circuit, wherein:
the third resistor is electrically connected to the second switch module in parallel,
a first end of the third resistor is electrically connected to the second voltage source,
a second end of the third resistor is electrically connected to at least one of the plurality of tuning/detuning circuit drivers,
the voltage comparison circuit is electrically connected to the second end of the third resistor and operatively connected to the processor,
the voltage comparison circuit is configured to obtain a first voltage of the second end of the third resistor and compare the first voltage with a reference voltage, and
the processor is configured to diagnose the tuning/detuning system based on the comparison between the first voltage and the reference voltage.

6. The control system of claim 5, wherein:
the diagnosis circuit system includes a third switch module, wherein the third switch module is electrically connected to the second voltage source in series, electrically connected to the third resistor in series, and operatively connected to the processor; and
the processor is configured to cause the third switch module to turn on or turn off.

7. The control system of claim 1, wherein:
the first voltage source includes a DC-DC controller, a fourth resistor, and a variable resistor, wherein:
the DC-DC controller is electrically connected to the first output end of the first voltage source though an output end of the DC-DC controller,
the fourth resistor is electrically connected to ground and electrically connected to the DC-DC controller through a feedback input of the DC-DC controller,
the variable resistor is electrically connected to the fourth resistor, electrically connected to the first output end of the first voltage source, and operatively connected to the processor, and
the processor is configured to cause an equivalent resistance value of the variable resistor to change.

8. A method, implemented on the control system according to claim 1, the method comprising:
determining, by the diagnosis circuit system, an expected value of an electrical signal according to at least one of an operation status of a radio frequency system, a tuning or detuning status of the plurality of coil arrays, or types of voltage sources of the plurality of tuning/detuning circuit drivers;
obtaining a first actual value of the electrical signal; and
performing, by the diagnosis circuit system, fault diagnosis on the tuning/detuning system based on the expected value of the electrical signal and the first actual value of the electrical signal, wherein the performing fault diagnosis on the tuning/detuning system based on the expected value of the electrical signal and the first actual value of the electrical signal comprises:
comparing the expected value of the electrical signal and the first actual value of the electrical signal; and
upon the determination that the first actual value is approximately the same as the expected value or that the difference between the first actual value and the expected value is below a threshold, determining that the tuning/detuning system is normal, or
upon the determination that the difference between the first actual value and the expected value exceeds the threshold, determining that a fault exists in the tuning/detuning system.

9. The method of claim 8, wherein:
the determining the expected value of the electrical signal includes:
upon a detection that the radio frequency system is idle and the plurality of coil arrays are electrically connected to the radio frequency system, making the second voltage source as the voltage source of the plurality of tuning/detuning circuit drivers;
determining the first current as the electrical signal; and
determining a first expected range of the first current; and
the performing fault diagnosis on the tuning/detuning system includes:
determining whether the first actual value of the first current falls within the first expected range of the first current.

10. The method of claim 9, wherein the performing fault diagnosis on the tuning/detuning system further includes:
determining that the first actual value of the first current falls within the first expected range of the first current; and
in response to a determination that the first actual value of the first current falls within the first expected range of the first current, determining that no short circuit exists at the plurality of first input ends of the plurality of tuning/detuning circuit drivers.

11. The method of claim 9, wherein the performing fault diagnosis on the tuning/detuning system further includes:
  determining that the first actual value of the first current fails to fall within the first expected range of the first current; and
  in response to a determination that the first actual value of the first current fails to fall within the first expected range of the first current, determining that a short circuit exists at at least one of the plurality of first input ends of the plurality of tuning/detuning circuit drivers.

12. The method of claim 9, wherein the performing fault diagnosis on the tuning/detuning system further includes:
  changing a type of the voltage source of one of the plurality of tuning/detuning circuit drivers to the first voltage source;
  obtaining a second actual value of the first current; and
  determining whether the second actual value of the first current increases by a predetermined increment.

13. The method of claim 12, wherein the performing fault diagnosis on the tuning/detuning system further includes:
  determining that the second actual value of the first current increases by a predetermined increment; and
  in response to a determination that the second actual value of the first current increases by the predetermined increment, determining that the tuning/detuning circuit driver and a corresponding coil array are normal.

14. The method of claim 12, wherein the performing fault diagnosis on the tuning/detuning system further includes:
  determining that the second actual value of the first current fails to increase by a predetermined increment; and
  in response to a determination that the second actual value of the first current fails to increase by the predetermined increment, determining that an open circuit exists in the tuning/detuning circuit driver or a corresponding coil array.

15. The method of claim 8, wherein
  the determining the expected value of the electrical signal includes:
    upon a detection that the radio frequency system is performing a scan and the plurality of coil arrays are electrically connected to the radio frequency system, determining the first current as the electrical signal; and
    determining a second expected range of the first current according to
  the number of coil arrays whose voltage source is the first voltage source; and
  the performing fault diagnosis on the tuning/detuning system includes:
    determining whether the first actual value of the first current falls within the second expected range of the first current.

16. The method of claim 8, further comprising:
  upon a detection that the radio frequency system is idle and the plurality of coil arrays are electrically disconnected from the radio frequency system, making the second voltage source as the voltage source of the plurality of tuning/detuning circuit drivers;
  determining the first current as the electrical signal; and
  determining a third expected range of the first current; and
  the performing fault diagnosis on the tuning/detuning system includes:
    determining whether the first actual value of the first current falls within the third expected range of the first current.

17. A method, implemented on the control system according to claim 1, the method comprising:
  upon a detection that a radio frequency system is idle and the plurality of coil arrays are electrically connected to the radio frequency system, making the second voltage source as the voltage source of the plurality of tuning/detuning circuit drivers and determining a first expected value of a first voltage;
  determining an actual value of the first voltage; and
  performing fault diagnosis on the tuning/detuning system by determining whether the actual value of the first voltage is greater than the first expected value of the first voltage;
  upon the determination that the actual value is approximately the same as the first expected value or that the difference between the actual value and the first expected value is below a threshold, determining that the system is normal; or
  upon the determination that the difference between the actual value and the first expected value exceeds the threshold, determining that a fault exists in the system.

18. The method of claim 17, further comprising:
  determining that the actual value of the first voltage is greater than the first expected value of the first voltage; and
  in response to a determination that the actual value of the first voltage is greater than the first expected value of the first voltage, determining that no short circuit exists in the plurality of tuning/detuning circuit drivers and the plurality of coil arrays.

19. The method of claim 17, further comprising:
  determining that the actual value of the first voltage is not greater than the first expected value of the first voltage; and
  in response to a determination that the actual value of the first voltage is not greater than the first expected value of the first voltage, determining that a short circuit exists in at least one of the plurality of tuning/detuning circuit drivers or the plurality of coil arrays.

* * * * *